US008669192B2

(12) United States Patent
Kawato et al.

(10) Patent No.: US 8,669,192 B2
(45) Date of Patent: Mar. 11, 2014

(54) VAPOR DEPOSITION DEVICE, VAPOR DEPOSITION METHOD, ORGANIC EL ELEMENT AND ORGANIC EL DISPLAY DEVICE

(75) Inventors: Shinichi Kawato, Osaka (JP); Satoshi Inoue, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/980,037

(22) PCT Filed: Jan. 4, 2012

(86) PCT No.: PCT/JP2012/050031
§ 371 (c)(1),
(2), (4) Date: Jul. 16, 2013

(87) PCT Pub. No.: WO2012/098927
PCT Pub. Date: Jul. 26, 2012

(65) Prior Publication Data
US 2013/0295716 A1 Nov. 7, 2013

(30) Foreign Application Priority Data
Jan. 18, 2011 (JP) ................................. 2011-007870

(51) Int. Cl.
*H01L 21/31* (2006.01)
*H01L 21/469* (2006.01)
*C23C 16/00* (2006.01)

(52) U.S. Cl.
USPC ...................... 438/758; 427/255.28; 118/720

(58) Field of Classification Search
USPC ...................... 438/758; 427/255.28; 118/720
See application file for complete search history.

(56) References Cited

U.S. PATENT DOCUMENTS 8,313,806 B2 * 11/2012 Matsuura ................. 427/255.28
2004/0115338 A1 6/2004 Yoneda
(Continued)

FOREIGN PATENT DOCUMENTS

DE 10 2009 011696 A1 9/2010
EP 1418250 A2 5/2004
(Continued)

OTHER PUBLICATIONS

International Search Report received for PCT Patent Application No. PCT/JP2012/050031 mailed on Apr. 10, 2012, 7 pages (4 pages of English Translation and 3 pages of ISR).

*Primary Examiner* — William D Coleman
(74) *Attorney, Agent, or Firm* — Morrison & Foerster LLP

(57) ABSTRACT

First and second vapor deposition particles (91a, 91b) discharged from first and second vapor deposition source openings (61a, 61b) pass through first and second limiting openings (82a, 82b) of a limiting plate unit (80), pass through mask opening (71) of a vapor deposition mask (70) and adhere to a substrate (10) so as to form a coating film. If regions on the substrate to which the first vapor deposition particles and the second vapor deposition particles adhere if the vapor deposition mask is assumed not to exist are respectively denoted by a first region (92a) and a second region (92b), the limiting plate unit limits the directionalities of the first vapor deposition particles and the second vapor deposition particles in a first direction (10a) that travel to the substrate such that the second region is contained within the first region. Accordingly, it is possible to form a light emitting layer with a doping method by using vapor deposition by color.

19 Claims, 31 Drawing Sheets

(56) References Cited

U.S. PATENT DOCUMENTS

| | | | |
|---|---|---|---|
| 2006/0045958 A1 | 3/2006 | Abiko et al. | |
| 2009/0017192 A1* | 1/2009 | Matsuura | 427/66 |
| 2009/0133629 A1 | 5/2009 | Kamikawa et al. | |
| 2009/0181163 A1 | 7/2009 | Uetake | |
| 2010/0075506 A1* | 3/2010 | Ochi | 438/758 |
| 2011/0306216 A1* | 12/2011 | Schuessler et al. | 438/758 |
| 2013/0059063 A1* | 3/2013 | Kawato et al. | 427/66 |
| 2013/0181209 A1* | 7/2013 | Sonoda et al. | 257/40 |
| 2013/0196454 A1* | 8/2013 | Inoue et al. | 438/5 |
| 2013/0240870 A1* | 9/2013 | Kawato et al. | 257/40 |
| 2013/0252353 A1* | 9/2013 | Kawato et al. | 438/14 |

FOREIGN PATENT DOCUMENTS

| | | |
|---|---|---|
| JP | 2004-103269 A | 4/2004 |
| JP | 2004-137583 A | 5/2004 |
| JP | 2004-349101 A | 12/2004 |
| JP | 2006-57173 A | 3/2006 |
| JP | 2006-249572 A | 9/2006 |
| JP | 2009-127066 A | 6/2009 |
| JP | 2009-170200 A | 7/2009 |
| KR | 10-2004-0043360 A | 5/2004 |

* cited by examiner

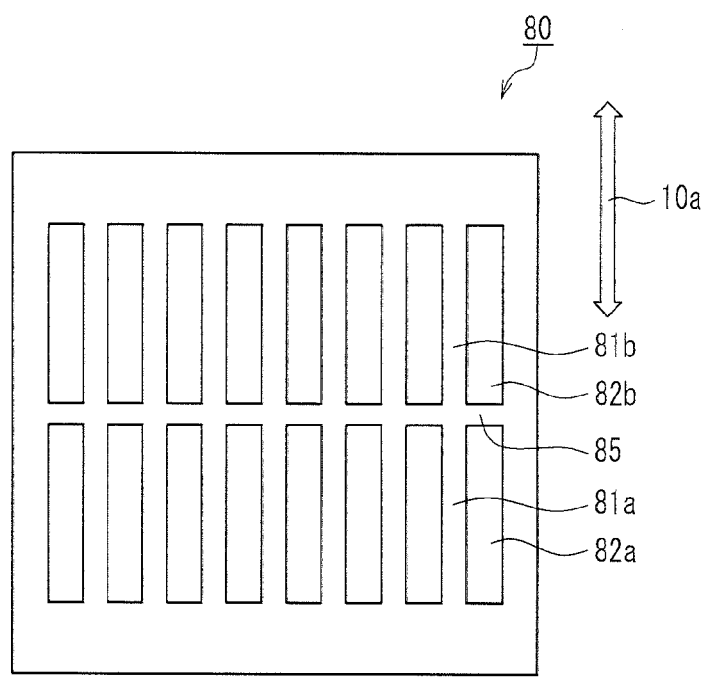
FIG. 7
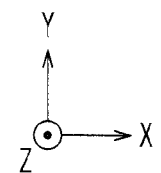

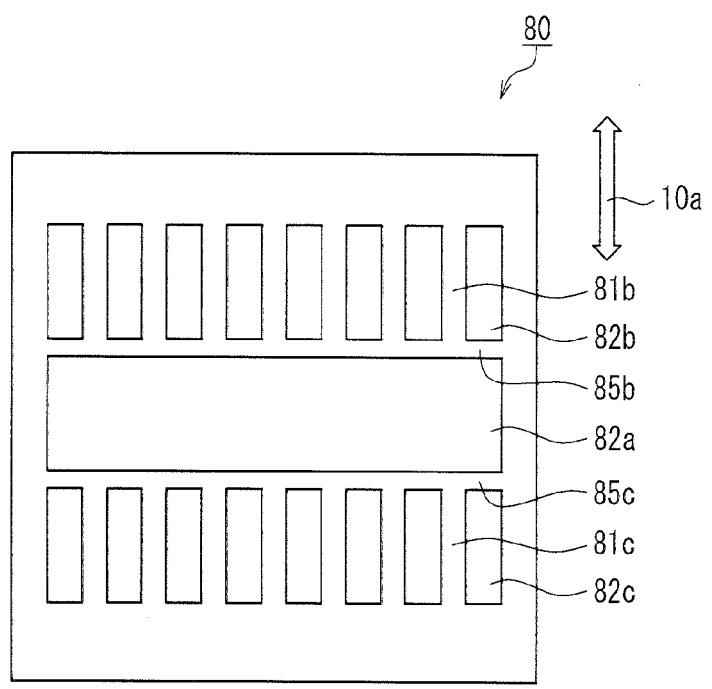
FIG. 26
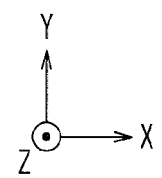

VAPOR DEPOSITION DEVICE, VAPOR DEPOSITION METHOD, ORGANIC EL ELEMENT AND ORGANIC EL DISPLAY DEVICE

CROSS REFERENCE TO RELATED APPLICATIONS

This is a U.S. national phase patent application of PCT/JP2012/050031 filed Jan. 4, 2012, which claims priority to Japanese patent application no. 2011-007870 filed Jan. 18, 2011, each of which is hereby incorporated by reference in the present disclosure in its entirety.

TECHNICAL FIELD

The present invention relates to a vapor deposition device and a vapor deposition method for forming a coating film having a predetermined pattern on a substrate. The present invention also relates to an organic EL (Electro Luminescence) element and an organic EL display device including a light emitting layer formed by vapor deposition.

BACKGROUND ART

In recent years, flat panel displays are used in various commodity products and fields, and thus flat panel displays are required to have a large size, high image quality and low power consumption.

Under the circumstances, organic EL display devices, which include an organic EL element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a light emitting layer are laminated between a pair of electrodes. The TFT is connected to one of the pair of electrodes. Then, voltage is applied across the pair of electrodes so as to cause the light emitting layer to emit light, whereby an image is displayed.

In a full-color organic EL display device, generally, organic EL elements including light emitting layers of respective colors of red (R), green (G) and blue (B) are formed and arranged on a substrate as sub-pixels. By causing these organic EL elements to selectively emit light at the desired brightness by using the TFT, a color image is displayed.

In order to manufacture an organic EL display device, it is necessary to form a light emitting layer made of organic light emitting materials that emit respective colors in a predetermined pattern for each organic EL element.

Known methods for forming light emitting layers in a predetermined pattern are vacuum vapor deposition method, inkjet method and laser transfer method. For example, the vacuum vapor deposition method is often used for low molecular organic EL display devices (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of a coating film is formed. Vapor deposition is performed for each color of the light emitting layer, which is referred to as "vapor deposition by color".

Patent Document 1 describes a vapor deposition device in which a plurality of line vapor deposition sources that respectively include slot-shaped discharge openings are disposed such that the longitudinal directions of the discharge openings are parallel to each other and a limiting plate is provided between the neighboring line vapor deposition sources in order to prevent a vapor deposition material from mixing. A substrate to which a vapor deposition mask is closely fixed is moved relative to the plurality of line vapor deposition sources in a direction orthogonal to the longitudinal directions of the discharge openings. The plurality of line vapor deposition sources include three line vapor deposition sources that respectively discharge, for example, an organic hole injection material, an organic hole transport material, and an organic light emitting material. Accordingly, a hole injection layer, a hole transport layer and a light emitting layer can be formed on a substrate in this order via mask openings of the vapor deposition mask.

Meanwhile, it is known that in an organic EL element, a light emitting layer is formed by using a doping method with which an additive called a "dopant" is added to a parent material called a "host" in order to obtain a desired luminescent color, to improve the light-emission efficiency, or the like.

CITATION LIST

Patent Document

Patent Document 1: JP 2009-170200A

DISCLOSURE OF INVENTION

Problem to be Solved by the Invention

With the vapor deposition device described in Patent Document 1 mentioned above, the plurality of line vapor deposition sources are separated from each other by limiting plates, and therefore the formation of a light emitting layer in which host and dopant are mixed on a substrate while discharging host and dopant from separate line vapor deposition sources is prevented.

It is an object of the present invention to provide a vapor deposition device that can preferably be used for forming a light emitting layer with a doping method by using vapor deposition by color.

Also, it is an object of the present invention to provide a vapor deposition method in which such a vapor deposition device is used.

Furthermore, it is an object of the present invention to provide an organic EL element and an organic EL display device including a light emitting layer in which dopants are dispersedly contained in host.

Means for Solving Problem

The vapor deposition device of the present invention is a vapor deposition device that forms, via a vapor deposition mask in which a mask opening is formed, a coating film having a pattern corresponding to an opening shape of the mask opening on a substrate, and the vapor deposition device includes a vapor deposition unit including a vapor deposition source having at least one first vapor deposition source opening and at least one second vapor deposition source opening, and a limiting plate unit in which at least one first limiting opening through which first vapor deposition particles discharged from the at least one first vapor deposition source opening pass and at least one second limiting opening through which second vapor deposition particles discharged from the at least second vapor deposition source opening pass are formed, and a moving mechanism that moves one of the substrate and the vapor deposition unit relative to the other along a first direction orthogonal to a normal line direction of the substrate. The at least one first vapor deposition source opening and the at least one second vapor deposition source opening are disposed at different positions in the first direction. The at least one first limiting opening and the at least one second limiting opening are disposed at different positions in the first direction. If regions on the substrate to which the first vapor deposition particles and the second vapor deposition particles adhere if the vapor deposition mask is assumed not to exist are respectively denoted by a first region and a second region, the limiting plate unit limits directionalities of the first vapor deposition particles and the second vapor deposition particles in the first direction that travel to the substrate such that the second region is contained within the first region, as viewed along a second direction orthogonal to the first direction and the normal line direction of the substrate.

The vapor deposition method is a vapor deposition method including a vapor deposition step of forming a coating film having a predetermined pattern on a substrate by causing vapor deposition particles to adhere onto the substrate, and the vapor deposition step is performed by using the vapor deposition device.

An organic EL element and an organic EL display device according to the present invention includes a coating film formed by using the above vapor deposition method of the present invention as a light emitting layer.

Effects of the Invention

According to the vapor deposition device and the vapor deposition method of the present invention, a coating film in which a plurality of different vapor deposition materials are mixed can be formed. Therefore, it is possible to form a light emitting layer with a doping method by using vapor deposition by color.

Also, a limiting plate unit limits the directionalities of vapor deposition particles traveling to the substrate in a first direction, and therefore the dimension of a region in the first direction on the substrate to which vapor deposition particles adhere can be reduced. As a result, the size of the device can be reduced.

The organic EL element and the organic EL display device of the present invention includes a coating film formed by using the above-described vapor deposition method as a light emitting layer, and therefore the organic EL element and the organic EL display device including a light emitting layer in which dopants are dispersedly contained in host can be provided.

BRIEF DESCRIPTION OF DRAWINGS

FIG. 7 is a plan view of a limiting plate unit constituting the vapor deposition device shown in FIG. 5.

FIG. 26 is a plan view of a limiting plate unit constituting the vapor deposition device shown in FIG. 25.

DESCRIPTION OF THE INVENTION

Figure 1:
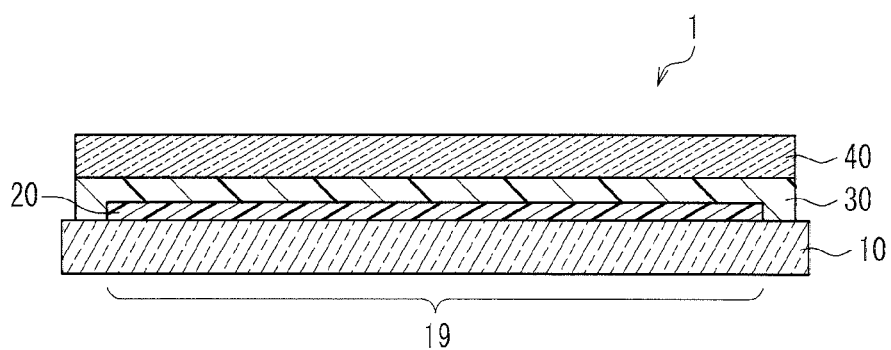
FIG. 1 is a cross-sectional view showing a schematic configuration of an organic EL display device.

The vapor deposition device of the present invention is a vapor deposition device that forms, via a vapor deposition mask in which a mask opening is formed, a coating film having a pattern corresponding to an opening shape of the mask opening on a substrate, and the vapor deposition device includes a vapor deposition unit including a vapor deposition source having at least one first vapor deposition source opening and at least one second vapor deposition source opening, and a limiting plate unit in which at least one first limiting opening through which first vapor deposition particles discharged from the at least one first vapor deposition source opening pass and at least one second limiting opening through which second vapor deposition particles discharged from the at least second vapor deposition source opening pass are formed, and a moving mechanism that moves one of the substrate and the vapor deposition unit relative to the other along a first direction orthogonal to a normal line direction of the substrate. The at least one first vapor deposition source opening and the at least one second vapor deposition source opening are disposed at different positions in the first direction. The at least one first limiting opening and the at least one second limiting opening are disposed at different positions in the first direction. If regions on the substrate to which the first vapor deposition particles and the second vapor deposition particles adhere if the vapor deposition mask is assumed not to exist are respectively denoted by a first region and a second region, the limiting plate unit limits directionalities of the first vapor deposition particles and the second vapor deposition particles in the first direction that travel to the substrate such that the second region is contained within the first region, as viewed along a second direction orthogonal to the first direction and the normal line direction of the substrate.

In the above description, the second region "is contained" within the first region encompasses both a case where the second region coincides with the first region and a case where the first region is wider than the second region so the first region includes the second region therein. Also, "a region on the substrate to which the first vapor deposition particles adhere if the vapor deposition mask is assumed not to exist" refers to a region on a substrate that can be seen from the first vapor deposition source opening from where the first vapor deposition particles are discharged via the first limiting opening. Similarly, "a region on the substrate to which the second vapor deposition particles adhere if the vapor deposition mask is assumed not to exist" refers to a region on a substrate that can be seen from the second vapor deposition source opening from where the second vapor deposition particles are discharged via the second limiting opening.

In the above-described vapor deposition device of the present invention, it is preferable that the limiting plate unit limits directionalities of the first vapor deposition particles and the second vapor deposition particles in the first direction that travel to the substrate such that a position of the first region coincides with a position of the second region in the first direction. Accordingly, it is possible to form a coating film which has a uniform mixing ratio between the first vapor deposition particles and the second vapor deposition particles in the thickness direction.

Alternatively, the limiting plate unit may limit directionalities of the first vapor deposition particles and the second vapor deposition particles in the first direction that travel to the substrate such that the first region protrudes beyond the second region in the first direction. Accordingly, it is possible to form a coating film in which a mixing layer which has a uniform mixing ratio between the first vapor deposition particles and the second vapor deposition particles in the thickness direction and a first material layer made only of the first vapor deposition particles are laminated on each other in the thickness direction.

In the above-described vapor deposition device of the present invention, it is preferable that at least one of the at least one first vapor deposition source opening and the at least one second vapor deposition source opening is inclined such that an opening direction of said vapor deposition source opening is tilted toward the other. Accordingly, the amount of vapor deposition material adhering to the limiting plate unit is reduced, and therefore the utilization efficiency of the vapor deposition material is improved. Also, the frequency at which a limiting plate unit is replaced can be reduced, and therefore throughput at the time of mass production is improved.

In the above-described vapor deposition device of the present invention, it is preferable that the at least one first vapor deposition source opening and the at least one second vapor deposition source opening are provided in a shared vapor deposition source. Accordingly, the size of the vapor deposition source can be reduced. Also, the sizes of a heating device and a heat insulating device to be attached to the vapor deposition source can be reduced, and moreover the number of such devices can be reduced, as a result of which the device cost can be reduced.

In the above-described vapor deposition device of the present invention, it is preferable that the at least one first limiting opening and the at least one second limiting opening are formed in a shared limiting plate unit. Accordingly, the size and the weight of the entire limiting plate unit can be reduced. As a result, the limiting plate unit can be easily replaced. Also, features of cooling the limiting plate unit can be improved, and therefore the flight directions of vapor deposition particles can be stably controlled.

In the above-described vapor deposition device of the present invention, it is preferable that the limiting plate unit includes a separation plate between the at least one first limiting opening and the at least one second limiting opening neighboring in the first direction. In this case, it is preferable that a surface of the separation plate on the side of the substrate is disposed at a position farther away from the substrate than a surface of a portion other than the separation plate of the limiting plate unit on the side of the substrate. Accordingly, the dimension of the separation plate in the first direction can be increased, and therefore a cooling device can be easily incorporated into the separation plate.

Alternatively, in the above-described vapor deposition device of the present invention, the limiting plate unit may include a first limiting plate unit in which the at least one first limiting opening is formed and a second limiting plate unit in which the at least one second limiting opening is formed, the first limiting plate unit and the second limiting plate unit being independent of each other. Accordingly, it is possible to separately replace the first limiting plate unit and the second limiting plate unit at an appropriate timing in accordance with the amount of vapor deposition material adhering thereto. Also, the sizes and the weights of the first limiting plate unit and the second limiting plate unit can be reduced, and therefore the operation for replacing only one of them is easily performed. Furthermore, only a material of the first vapor deposition particles and a material of the second vapor deposition particles are easily separately recovered from the first limiting plate unit and from the second limiting plate respectively, and therefore a vapor deposition material can be easily re-used.

In the above-described vapor deposition device of the present invention, it is preferable that a plurality of first limiting openings through which the first vapor deposition particles pass and a plurality of second limiting openings through which the second vapor deposition particles pass are formed in the limiting plate unit. In this case, it is preferable that the plurality of first limiting openings are partitioned by a plurality of first limiting plates in the second direction, and the plurality of second limiting openings are partitioned by a plurality of second limiting plates in the second direction. Furthermore, it is preferable that the plurality of first limiting plates limit incidence angles of the first vapor deposition particles in the second direction that enter the mask opening, and the plurality of second limiting plates limit incidence angles of the second vapor deposition particles in the second direction that enter the mask opening. Accordingly, the widths of blurred portions on both sides of the coating film in the second direction can be reduced. As a result, if vapor deposition by color is performed using this vapor deposition device to form a light emitting layer, it is possible to prevent color mixing from occurring. Thus, it is possible to realize a highly reliable organic EL display device capable of displaying high definition and very bright images.

Alternatively, in the above-described vapor deposition device of the present invention, a single first limiting opening through which the first vapor deposition particles pass and a plurality of second limiting openings through which the second vapor deposition particles pass may be formed in the limiting plate unit. In this case, it is preferable that the plurality of second limiting openings are partitioned by a plurality of second limiting plates in the second direction. Furthermore, it is preferable that the plurality of second limiting plates limit incidence angles of the second vapor deposition particles in the second direction that enter the mask opening. Accordingly, it is possible to form a coating film including a coating film main portion made by mixing the first vapor deposition particles and the second vapor deposition particles and blurred portions made substantially only of the first vapor deposition particles on both sides of the coating film main portion in the second direction. In the above description, in the case where a material of the first vapor deposition particles is a host and a material of the second vapor deposition particles is a luminescent dopant, a light emitting region depends on the distribution of dopants. Thus, if vapor deposition by color is performed using this vapor deposition device to form a light emitting layer, it is possible to prevent color mixing from occurring, and therefore it is possible to realize a highly reliable organic EL display device capable of displaying high definition and very bright images. Also, because the amount of the first vapor deposition particles adhering to the limiting plate unit can be reduced, the utilization efficiency of material is improved, and moreover the frequency at which the limiting plate unit is replaced can be reduced.

In the above-described vapor deposition device of the present invention, the vapor deposition source may further include at least one third vapor deposition source opening. In this case, it is preferable that at least one third limiting opening through which third vapor deposition particles discharged from the at least one third vapor deposition source opening pass is further formed in the limiting plate unit. It is preferable that the at least one third vapor deposition source opening is disposed at a different position in the first direction from the positions of the at least one first vapor deposition source opening and the at least one second vapor deposition source opening. Also, it is preferable that the at least one third limiting opening is disposed at a different position in the first direction from the positions of the at least one first limiting opening and the at least one second limiting opening. It is preferable that if a region on the substrate to which the third vapor deposition particles adhere if the vapor deposition mask is assumed not to exist is denoted by a third region, the limiting plate unit limits a directionality of the third vapor deposition particles in the first direction that travel to the substrate such that the third region is contained within the first region, as viewed along the second direction.

In the above description, the third region "is contained" within the first region encompasses both a case where the third region coincides with the first region and a case where the first region is wider than the third region and the first region includes the third region therein. Also, "a region on the substrate to which the third vapor deposition particles adhere if the vapor deposition mask is assumed not to exist" refers to a region on a substrate that can be seen from the third vapor deposition source opening from where the third vapor deposition particles are discharges via third limiting opening.

With the above-described preferred configuration, it is possible to form a coating film containing a portion in which the first vapor deposition particles and the third vapor deposition particles are mixed, or a portion in which the first vapor deposition particles, the second vapor deposition particles and the third vapor deposition particles are mixed.

In the above-described vapor deposition device, it is preferable that the limiting plate unit limits directionalities of the first vapor deposition particles, the second vapor deposition particles and the third vapor deposition particles in the first direction that travel to the substrate such that a position of the first region, a position of the second region and a position of the third region coincide with one another in the first direction. Accordingly, it is possible to form a coating film which has a uniform mixing ratio among the first vapor deposition particles, the second vapor deposition particles and the third vapor deposition particles in the thickness direction.

Alternatively, in the above-described vapor deposition device, the limiting plate unit may limit directionalities of the first vapor deposition particles, the second vapor deposition particles and the third vapor deposition particles in the first direction that travel to the substrate such that the position of the second region coincides with the position of the third region in the first direction and the first region protrudes beyond the second region and the third region in the first direction. Accordingly, it is possible to form a coating film in which a mixing layer which has a uniform mixing ratio among the first vapor deposition particles, the second vapor deposition particles and the third vapor deposition particles in the thickness direction and a first material layer made only of the first vapor deposition particles are laminated on each other in the thickness direction.

It is preferable that the vapor deposition device further includes a shutter that selectively blocks either one of the flow of the second vapor deposition particles and the flow of the third vapor deposition particles that travel to the substrate, and a shift mechanism that moves the vapor deposition mask or the substrate in the second direction. Accordingly, it is possible to easily form a first coating film in which the first vapor deposition particles and the second vapor deposition particles are mixed and a second coating film in which the first vapor deposition particles and the third vapor deposition particles are mixed at different positions in the second direction on the substrate.

It is preferable that the limiting plate unit limits directionalities of the first vapor deposition particles, the second vapor deposition particles and the third vapor deposition particles in the first direction that travel to the substrate such that the second region and the third region do not overlap on each other and the first region contains the second region and the third region, as viewed along the second direction. Accordingly, it is possible to easily form the first coating film in which the first vapor deposition particles and the second vapor deposition particles are mixed and the second coating film in which the first vapor deposition particles and the third vapor deposition particles are mixed at different positions in the second direction on the substrate. Alternatively, it is possible to easily form, on the substrate, a coating film containing a first mixing layer in which the first vapor deposition particles and the second vapor deposition particles are mixed and a second mixing layer in which the first vapor deposition particles and the third vapor deposition particles are mixed.

In the above-described vapor deposition device of the present invention, it is preferable that the vapor deposition unit includes the vapor deposition mask. In this case, it is preferable that the mask opening formed in the vapor deposition mask includes a first mask opening formed in a region of the vapor deposition mask corresponding to the second region and a second mask opening formed in a region of the vapor deposition mask corresponding to the third region. In addition, it is preferable that the first mask opening and the second mask opening are disposed at different positions from each other in the second direction. Accordingly, it is possible to easily form the first coating film in which the first vapor deposition particles and the second vapor deposition particles are mixed and the second coating film in which the first vapor deposition particles and the third vapor deposition particles are mixed at different positions in the second direction on the substrate.

In the above-described vapor deposition device of the present invention, it is preferable that the vapor deposition unit includes the vapor deposition mask. In this case, it is preferable that the mask opening formed in the vapor deposition mask extends along the first direction from the region corresponding to the second region to the region corresponding to the third region. Accordingly, it is possible to easily form, on the substrate, a coating film containing the first mixing layer in which the first vapor deposition particles and the second vapor deposition particles are mixed and the second mixing layer in which the first vapor deposition particles and the third vapor deposition particles are mixed.

In the above-described vapor deposition device of the present invention, it is preferable that a plurality of third limiting openings through which the third vapor deposition particles pass are formed in the limiting plate unit. In this case, it is preferable that the plurality of third limiting openings are partitioned by a plurality of third limiting plates in the second direction. In addition, it is preferable that the plurality of third limiting plates limit incidence angles of the third vapor deposition particles in the second direction that enter the mask opening. Accordingly, it is possible to prevent the third vapor deposition particles from causing blurring on both sides of the coating film in the second direction. In the above description, in the case where a material of the first vapor deposition particles is a host and a material of the third vapor deposition particles is a luminescent dopant, it is possible to prevent color mixing from occurring, and therefore it is possible to realize a highly reliable organic EL display device capable of displaying high definition and very bright images.

In the above-described vapor deposition device of the present invention, it is preferable that the vapor deposition unit includes the vapor deposition mask. In this case, the moving mechanism moves one of the substrate and the vapor deposition unit relative to the other along the first direction, in a state in which the substrate and the vapor deposition mask are spaced apart at a fixed spacing. Accordingly, the dimension of the vapor deposition mask in the first direction can be made smaller than the dimension of the substrate in the first direction. Therefore, it is possible to suppress bending or extension of the vapor deposition mask due to its own weight, and thus vapor deposition can be easily performed on large-sized substrates.

Alternatively, in the above-described vapor deposition device, the vapor deposition mask may be fixed to the substrate. Accordingly, the spacing between the substrate and the vapor deposition mask can be reduced, and therefore the necessity for a design which limits the incidence angles of vapor deposition particles in the second direction that enter mask openings of the vapor deposition mask is reduced. As a result, it is possible to improve a vapor deposition rate and throughput at the time of mass production.

The vapor deposition method of the present invention is a vapor deposition method including a vapor deposition step of forming a coating film having a predetermined pattern on a substrate by causing vapor deposition particles to adhere onto the substrate, and the vapor deposition step is performed by using the vapor deposition device.

In the above-described vapor deposition method of the present invention, it is preferable that the coating film contains a portion in which the first vapor deposition particles and the second vapor deposition particles are mixed. Accordingly, it is possible to form a light emitting layer for an organic EL element in which dopants are mixed into a host.

It is preferable that the coating film has a uniform mixing ratio between the first vapor deposition particles and the second vapor deposition particles in the thickness direction. Accordingly, the entire portion of the coating film in the thickness direction can be used as a light emitting layer.

In the above-described vapor deposition method of the present invention, it is preferable that the coating film includes a coating film main portion in which the first vapor deposition particles and the second vapor deposition particles are mixed and blurred portions that are formed on both sides of the coating film main portion in the second direction and are made only of the first vapor deposition particles. Accordingly, it is possible to improve the utilization efficiency of material of the first vapor deposition particles and to reduce the frequency at which the limiting plate unit is replaced, while preventing color mixing from occurring.

In the above-described vapor deposition method of the present invention, it is preferable that the coating film includes a mixing layer in which the first vapor deposition particles and the second vapor deposition particles are mixed and a first material layer that is laminated on at least one side of the mixing layer and is made only of the first vapor deposition particles. Accordingly, if materials of the first vapor deposition particles and the second vapor deposition particles are appropriately selected, a light emitting layer and an electron transport layer or a hole blocking layer can be successively formed.

In the above-described vapor deposition method of the present invention, it is preferable that the coating film contains a portion in which the first vapor deposition particles, the second vapor deposition particles and the third vapor deposition particles are mixed. Accordingly, a light emitting layer for an organic EL element in which different dopants are mixed into a host can be formed.

In the above-described vapor deposition method of the present invention, it is preferable that the coating film has a uniform mixing ratio among the first vapor deposition particles, the second vapor deposition particles and the third vapor deposition particles in the thickness direction. Accordingly, the entire portion of the coating film in the thickness direction can be used as a light emitting layer that emits light in the same color.

In the above-described vapor deposition method of the present invention, it is preferable that the coating film includes a coating film main portion in which the first vapor deposition particles, the second vapor deposition particles and the third vapor deposition particles are mixed and blurred portions that are formed on both sides of the coating film main portion in the second direction and are made only of the first vapor deposition particles. Accordingly, it is possible to improve the utilization efficiency of material of the first vapor deposition particles and to reduce the frequency at which the limiting plate unit is replaced, while preventing color mixing from occurring.

In the above-described vapor deposition method of the present invention, it is preferable that the coating film includes a mixing layer in which the first vapor deposition particles, the second vapor deposition particles and the third vapor deposition particles are mixed and a first material layer that is laminated on at least one side of the mixing layer and is made only of the first vapor deposition particles. Accordingly, if materials of the first vapor deposition particles and the second vapor deposition particles are appropriately selected, a light emitting layer and an electron transport layer or a hole blocking layer can be successively formed.

In the above-described vapor deposition method of the present invention, a first coating film in which the first vapor deposition particles and the second vapor deposition particles are mixed and a second coating film in which the first vapor deposition particles and the third vapor deposition particles are mixed may be formed at different positions on the substrate. Accordingly, it is possible to easily form two types of coating films whose compositions differ at different positions in the same vacuum chamber, using a shared first vapor deposition source opening.

In the above-described vapor deposition method of the present invention, the coating film may contain a first mixing layer in which the first vapor deposition particles and the second vapor deposition particles are mixed and a second mixing layer in which the first vapor deposition particles and the third vapor deposition particles are mixed. Accordingly, if materials of the first, second and the third vapor deposition particles are appropriately selected, it is possible to form an organic EL element including light emitting layers that emit light of predetermined colors in the same vacuum chamber using a shared first vapor deposition source opening. Such an organic EL element can be used as, for example, a sheet-like light emitting body.

In the above-described vapor deposition method, the coating film may contain a first material layer made only of the first particles between the first mixing layer and the second mixing layer.

In the above-described vapor deposition method of the present invention, it is preferable that a material of the first vapor deposition particles is a host constituting a light emitting layer for an organic EL element, and a material of the second vapor deposition particles is a dopant constituting a light emitting layer for an organic EL element. Also, it is preferable that a material of the third vapor deposition particles is a dopant constituting a light emitting layer for an organic EL element. Accordingly, it is possible to form a light emitting layer using a doping method.

It is preferable that the coating film is a light emitting layer for an organic EL element.

Hereinafter, the present invention will be described in detail by showing preferred embodiments. It should be noted, however, that the present invention is not limited to the following embodiments. For the sake of convenience of the description, the drawings referred to hereinafter show only the principal members required to describe the present invention in simplified form among the constituent members of the embodiments of the present invention. Accordingly, the present invention may include optional constituent members that are not shown in the following drawings. Also, the dimensions of the members in the drawings do not faithfully represent the actual dimensions or dimensional proportions of the constituent members.

(Configuration of Organic EL Display Device)

An example of an organic EL display device that can be manufactured by applying the present invention will be described. This organic EL display device is a bottom emission type organic EL display device in which light is extracted from the TFT substrate side and that displays full color images by controlling light emission of red (R), green (G) and blue (B) pixels (sub-pixels).

First, the overall configuration of the organic EL display device will be described below.

Figure 2:
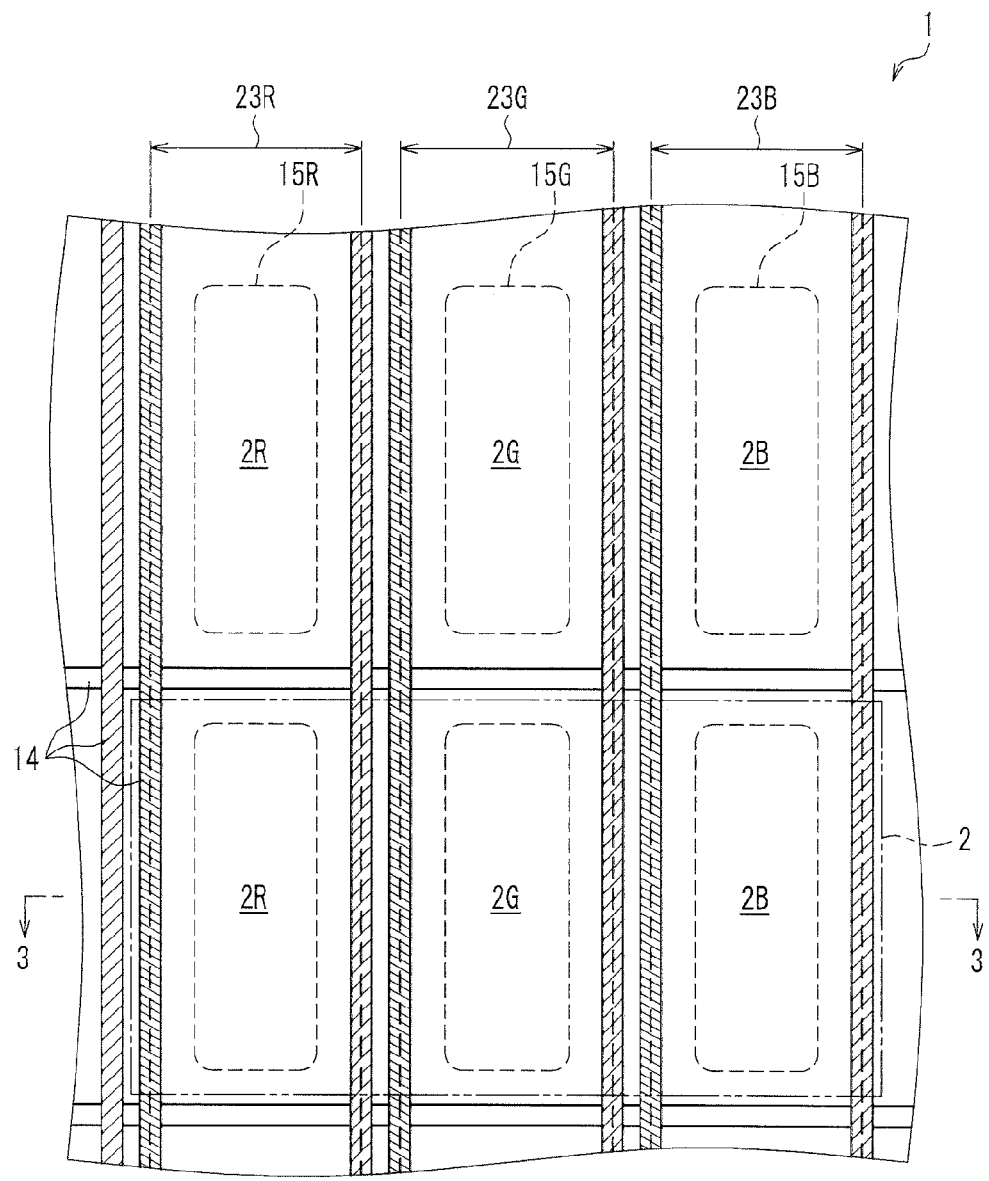
FIG. 2 is a plan view showing a configuration of pixels that constitute the organic EL display device shown in FIG. 1.
Figure 3:
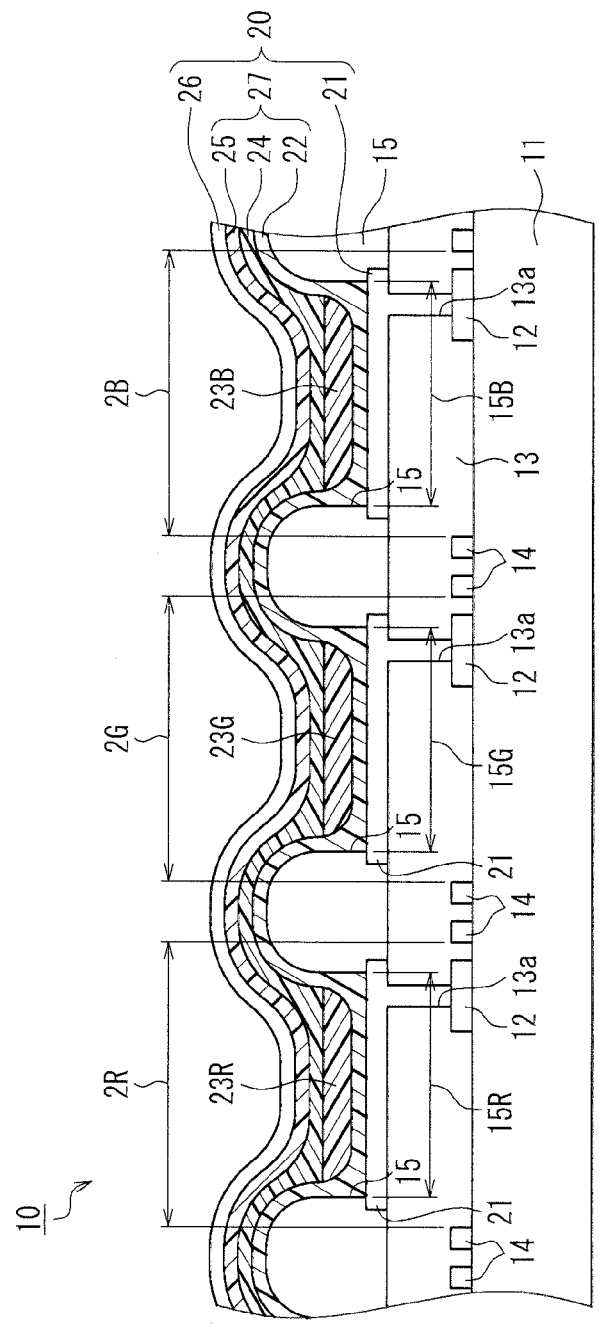
FIG. 3 is a cross-sectional view of a TFT substrate that constitutes the organic EL display device taken along the line 3-3 of FIG. 2.

FIG. 1 is a cross-sectional view showing a schematic configuration of the organic EL display device. FIG. 2 is a plan view showing a configuration of pixels that constitute the organic EL display device shown in FIG. 1. FIG. 3 is a cross-sectional view of a TFT substrate that constitutes the organic EL display device, taken along the line III-III of FIG. 2.

As shown in FIG. 1, the organic EL display device 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display device 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display device, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the vertical direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in their respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described.

As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the organic EL layer 27. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the organic EL layer.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

(Manufacturing Method for Organic EL Display Device)

A method for manufacturing an organic EL display device 1 will be described below.

Figure 4:
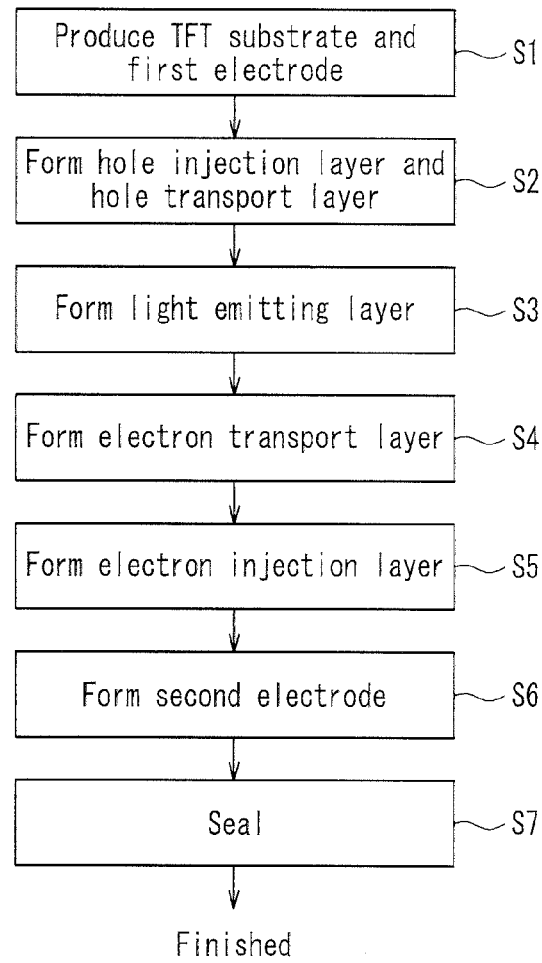
FIG. 4 is a flowchart illustrating the steps of a process for manufacturing an organic EL display device in order.

FIG. 4 is a flowchart illustrating the steps of a process for manufacturing the above-described organic EL display device 1 in order.

As shown in FIG. 4, the method for manufacturing an organic EL display device 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. As an example, a rectangular glass plate having a thickness of about 1 mm and longitudinal and transverse dimensions of 500×400 mm can be used as the insulating substrate 11.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Generally, polyimide resin is not transparent but colored. For this reason, when manufacturing a bottom emission type organic EL display device 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the inter-layer film 13 are formed.

Next, a first electrode 21 is formed on the inter-layer film 13. Specifically, a conductive film (electrode film) is formed on the inter-layer film 13. Next, a photoresist is applied onto the conductive film and patterning is performed by using a photolithography technique, after which the conductive film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials that can be used for the first electrode 21 include transparent conductive materials such as ITO (indium tin oxide), IZO (indium zinc oxide) and gallium-added zinc oxide (GZO); and metal materials such as gold (Au), nickel (Ni) and platinum (Pt).

As the method for laminating conductive films, it is possible to use a sputtering method, a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the edge cover 15. As an example, an edge cover 15 having a thickness of about 1 μm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, heterocyclic or linear conjugated monomers, oligomers or polymers, such as polysilane-based compounds, vinylcarbazole-based compounds, thiophene-based compounds, aniline-based compounds and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex, bis(benzoquinolinato) beryllium complex, tri(dibenzoylmethyl)phenanthroline europium complex, ditolyl vinyl biphenyl and the like.

The light emitting layers 23R, 23G and 23B may be constituted only by the above-described organic light emitting material, or may include a hole transport layer material, an electron transport layer material, additives (donor, acceptor, and the like), a luminescent dopant, and the like. Also, a configuration may be adopted in which these materials are dispersed in a polymeric material (resin for binding) or an inorganic material. It is preferable that luminescent dopants are dispersed in host from the view are tilted of improving light-emission efficiency and achieving a long service life.

There is no particular limitation on luminescent dopants, and a known dopant material can be used. For example, examples of dopants include aromatic dimethylidene derivatives such as 4,4'-bis(2,2'-diphenylvinyl)-biphenyl (DPVBi), 4,4'-bis[2-{4-(N,N-diphenylamino)phenyl}vinyl]biphenyl (DPAVBi) and the like, styryl derivatives, perylene, iridium complex, coumarin derivatives such as coumarin 6 and the like, lumogen F red, dicyanomethylene pyran, phenoxazon, porphyrin derivatives, and the like. Note that a red light emitting layer 23R that emits red light, a green light emitting layer 23G that emits green light, and a blue light emitting layer 23B tht emits blue light are formed by appropriately selecting types of dopants.

Examples of a host material serving as a dispersion medium for luminescent dopants include, for example, a material same as the material for forming the light emitting layers 23R, 23G and 23B, carbazole derivatives, and the like.

In the case where a light emitting layer in which dopants are dispersed in host is formed, there is no particular limitation on the content of dopant in the host, and the content can be changed as appropriate in accordance with each material, but it is preferable that the content of dopant in the host is generally about several % to 30%.

The light emitting layers 23R, 23G and 23B can have a thickness of, for example, 10 to 100 nm.

The vapor deposition method and the deposition device of the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof, LiF (lithium fluoride) and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display device 1 is obtained.

In the organic EL display device 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, step S3, which is the step of forming light emitting layers 23R, 23G and 23B by vapor deposition by color, will be described.

Embodiment 1

Figure 5:
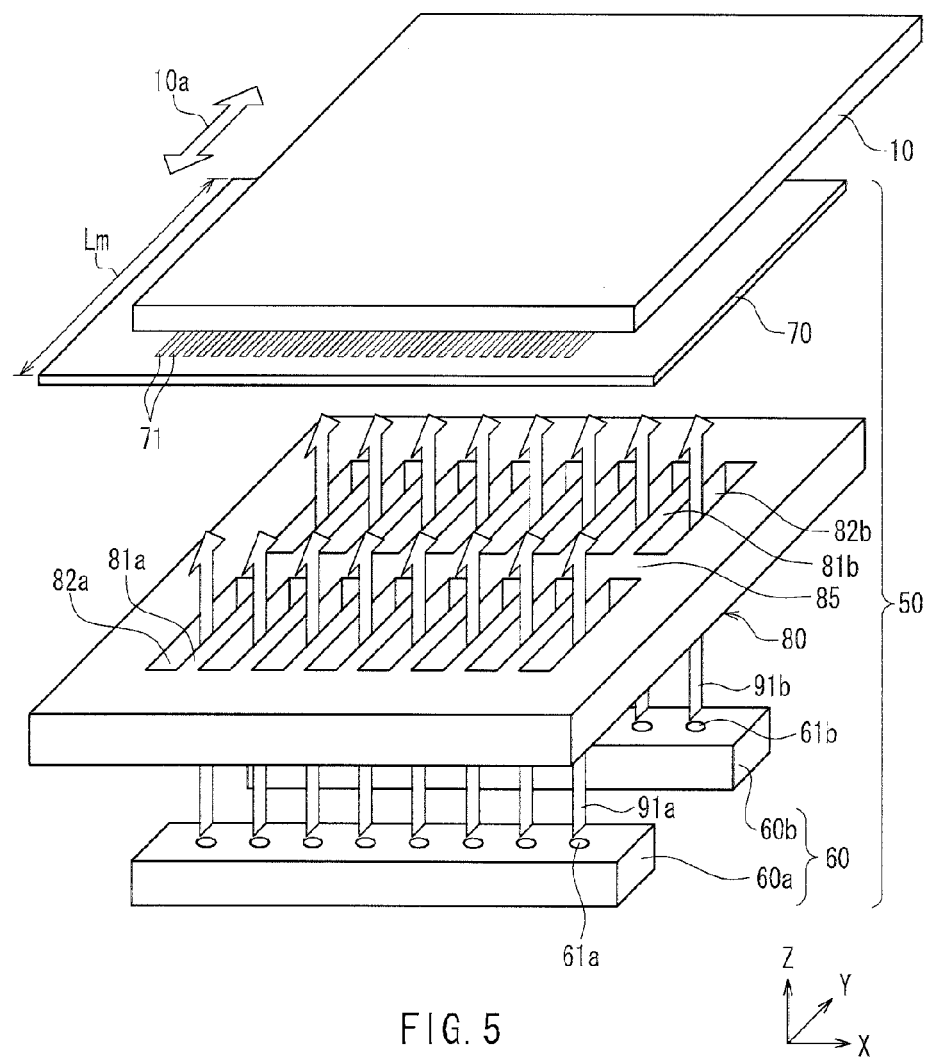
FIG. 5 is a perspective view showing the basic configuration of a vapor deposition device according to Embodiment 1 of the present invention.
Figure 6:
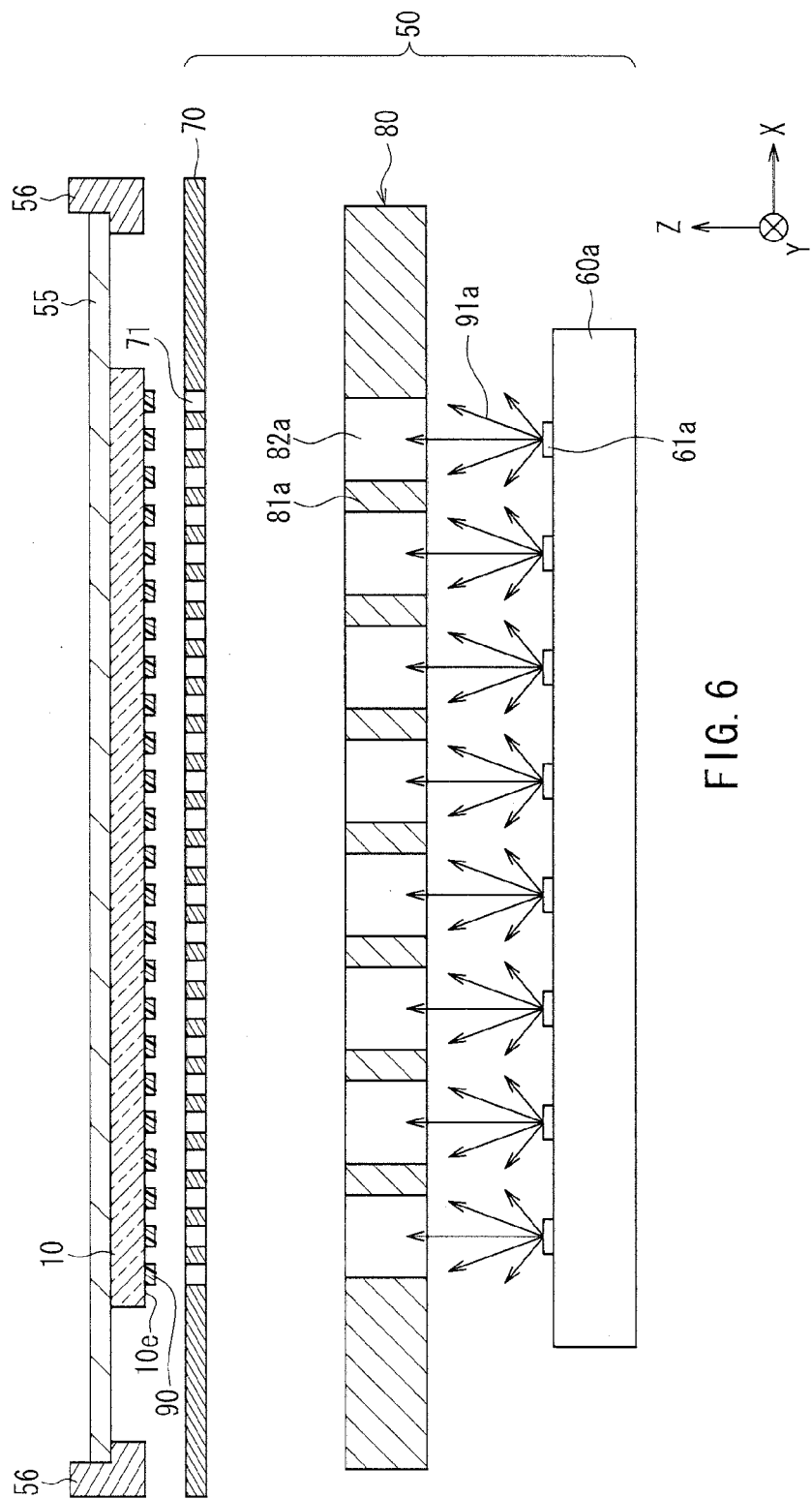
FIG. 6 is a front-cross sectional view of the vapor deposition device shown in FIG. 5, along a plane that is perpendicular to the traveling direction of the substrate and passes across first vapor deposition source openings.

FIG. 5 is a perspective view showing the basic configuration of the vapor deposition device according to Embodiment 1 of the present invention. FIG. 6 is a front cross-sectional view of the vapor deposition device shown in FIG. 5, along a plane passing across a first vapor deposition source 60a.

A vapor deposition source 60, a vapor deposition mask 70, and a limiting plate unit 80 disposed therebetween constitute a vapor deposition unit 50. The substrate 10 moves along an arrow 10a at a constant speed with respect to the vapor deposition mask 70 on the opposite side from the vapor deposition source 60. For the sake of convenience of the description given below, an XYZ orthogonal coordinate system is set in which a horizontal axis parallel to the movement direction (first direction) 10a of the substrate 10 is defined as the Y axis, a horizontal axis perpendicular to the Y axis is defined as the X axis, and a vertical axis perpendicular to the X axis and the Y axis is defined as the Z axis. The Z axis is parallel to the normal line direction of the deposition surface 10e of the substrate 10. To facilitate the description, the side to which the arrow indicating the Z axis are tilted (the upper side of FIG. 6) is referred to as the "upper side".

The vapor deposition source 60 has a first vapor deposition source 60a and a second vapor deposition source 60b. The first vapor deposition source 60a and the second vapor deposition source 60b respectively have a plurality of first vapor deposition source openings 61a and a plurality of second vapor deposition source openings 61b, in their upper surfaces (that is, the surface opposing the vapor deposition mask 70). The plurality of first vapor deposition source openings 61a and the plurality of second vapor deposition source openings 61b are arranged at different positions in the Y axis direction, and are arranged at a fixed pitch along a straight line parallel to the X axis direction. The plurality of first vapor deposition source openings 61a and the plurality of second vapor deposition source openings 61b are arranged at the same positions in the X axis direction. Each of the vapor deposition source openings 61a and 61b has a nozzle shape that is upwardly open parallel to the Z axis. The first vapor deposition source openings 61a and the second vapor deposition source openings 61b respectively discharge vapor made from a first material (that is, first vapor deposition particles 91a) and vapor made from a second material (that is, second vapor deposition particles 91b) that serve as materials for light emitting layers. For example, vapor (first vapor deposition particles 91a) for a host constituting a light emitting layer can be discharged from the first vapor deposition source openings 61a of the first vapor deposition source 60a, and vapor (second vapor deposition particles 91b) for a dopant constituting a light emitting layer can be discharged from the second vapor deposition source openings 61b of the second vapor deposition source 60b.

The vapor deposition mask 70 is a plate-shaped piece that has a major surface (the surface having the largest area) parallel to the XY plane and in which a plurality of mask openings 71 are formed along the X axis direction at different positions in the X axis direction. The mask openings 71 are through holes that penetrate the vapor deposition mask 70 in the Z axis direction. In the present embodiment, each mask opening 71 has an opening shape having a slot shape that is parallel to the Y axis, but the present invention is not limited thereto. All of the mask openings 71 may have the same shape and dimensions, or may have different shapes and dimensions. The pitch in the X axis direction of the mask openings 71 may be constant or different.

It is preferable that the vapor deposition mask 70 is held by a mask tension mechanism (not shown). The mask tension mechanism prevents the occurrence of bending or extension of the vapor deposition mask 70 due to its own weight, by applying tension to the vapor deposition mask 70 in a direction parallel to the major surface thereof.

The limiting plate unit 80 is disposed between the vapor deposition source openings 61 and the vapor deposition mask 70. FIG. 7 is a plan view of the limiting plate unit 80. A plurality of limiting openings which are through holes that respectively penetrate the limiting plate unit 80 in the Z axis direction are formed in the limiting plate unit 80. The plurality of limiting openings includes a plurality of first limiting openings 82a disposed along a straight line parallel to the X axis direction and a plurality of second limiting openings 82b disposed along another straight line parallel to the X axis direction. The first limiting openings 82a neighboring in the X axis direction are separated by a first limiting plate 81a, and the second limiting openings 82b neighboring in X axis direction are separated by a second limiting plate 81b. A plurality of the first limiting plates 81a are arranged along the X axis direction at a fixed pitch, and a plurality of the second limiting plates 81b also are arranged along the X axis direction at a fixed pitch. The plurality of first limiting openings 82a and the plurality of second limiting openings 82b are arranged at the same positions in the X axis direction. The plurality of first limiting openings 82a and the plurality of second limiting openings 82b are arranged at different positions in the Y axis direction. The first limiting opening 82a and the second limiting opening 82b neighboring in the Y axis direction are separated by a separation plate 85.

The limiting plate unit 80 may include a cooling device for cooling the limiting plate unit 80 in order to prevent a vapor deposition material that has adhered thereto from re-vaporizing or the like. Although there is no particular limitation on a cooling device, for example, a pipe for allowing a coolant (for example, water) to pass through, a cooling element such as a Peltier element or the like can be arbitrarily selected.

A vapor deposition material adheres to the limiting plate unit 80. Therefore, it is preferable that the limiting plate unit 80 to which a vapor deposition material has adhered is replaced by a new one in each predetermined period. The limiting plate unit 80 may be configured so as to be dividable into a plurality of portions in order to facilitate the operation for replacing the limiting plate unit 80.

Although the number of the first and second vapor deposition source openings 61a and 61b and the first and second limiting openings 82a and 82b that are arranged in the X axis direction is respectively eight in FIGS. 5, 6 and 7, the present invention is not limited to this and the number may be larger or smaller than this.

The plurality of vapor deposition source openings 61a and 61b are spaced apart from the limiting plate unit 80 in the Z axis direction, and the limiting plate unit 80 and the vapor deposition mask 70 are spaced apart from each other in Z axis direction. It is preferable that the relative positions between the vapor deposition sources 60a and 60b, the limiting plate unit 80, and the vapor deposition mask 70 are substantially constant at least during vapor deposition by color.

The substrate 10 is held by a holding device 55. As the holding device 55, for example, an electrostatic chuck that holds the surface of the substrate 10 opposite to the deposition surface 10e of the substrate 10 with electrostatic force can be used. The substrate 10 can thereby be held substantially without the substrate 10 being bent by its own weight. However, the holding device 55 for holding the substrate 10 is not limited to an electrostatic chuck and may be any other device.

The substrate 10 held by the holding device 55 is scanned (moved) in the movement direction 10a parallel to the Y axis at a constant speed by a moving mechanism 56, on the opposite side from the vapor deposition source 60 with respect to the vapor deposition mask 70, with the substrate 10 being spaced apart from the vapor deposition mask 70 at a fixed spacing. The movement of the substrate 10 may be a reciprocal movement or a single direction movement in which the substrate 10 is moved in either direction. There is no particular limitation on the configuration of the moving mechanism 56. For example, any known transfer driving mechanism can be used such as a linear motor or a feed screw mechanism that rotates a feed screw by a motor.

The vapor deposition unit 50, the substrate 10, the holding device 55 for holding the substrate 10 and the moving mechanism 56 for moving the substrate 10 are housed in a vacuum chamber (not shown). The vacuum chamber is a hermetically sealed container, with the pressure in its internal space being reduced and maintained in a predetermined low pressure state.

The first vapor deposition particles 91a discharged from the first vapor deposition source openings 61a pass through the first limiting openings 82a of the limiting plate unit 80 and the mask openings 71 of the vapor deposition mask 70 in this order. The second vapor deposition particles 91b discharged from the second vapor deposition source openings 61b pass through the second limiting openings 82b of the limiting plate unit 80 and the mask openings 71 of the vapor deposition mask 70 in this order. The first and second vapor deposition particles 91a and 91b that have passed through the mask openings 71 adhere to the deposition surface (specifically, the surface of the substrate 10 opposing the vapor deposition mask 70) 10e of the substrate 10 traveling in the Y axis direction to form a coating film 90 in which the first and second vapor deposition particles 91a and 91b are mixed. The coating film 90 has a stripe shape extending in the Y axis direction. As described above, if a material of the first vapor deposition particles 91 is host and a material of the second vapor deposition particles 91b is dopant, the coating film 90 in which dopants are dispersedly contained in host can be formed.

The first vapor deposition particles 91a that are to form the coating film 90 necessarily pass through the first limiting opening 82a and the mask opening 71. Also, the second vapor deposition particles 91b that are to form the coating film 90 necessarily pass through the second limiting opening 82b and the mask opening 71. The limiting plate unit 80 and the vapor deposition mask 70 are designed so as to prevent a situation in which the vapor deposition particles 91a and 91b discharged from the vapor deposition source openings 61a and 61b reach the deposition surface 10e of the substrate 10 without passing through the limiting openings 82a and 82b and the mask openings 71, and if necessary, a shielding plate (not shown) or the like that prevents flight of the vapor deposition particles 91a and 91b may be installed.

By performing vapor deposition three times by changing materials of the first vapor deposition particles 91a and/or the second vapor deposition particles 91b for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

According to Embodiment 1, the substrate 10 moves along the movement direction 10a relative to the vapor deposition unit 50 including the vapor deposition mask 70, and thus a dimension Lm of the vapor deposition mask 70 in the movement direction 10a of the substrate 10 can be set irrespective of a dimension of the substrate 10 in the same direction. This enables the use of a vapor deposition mask 70 that is smaller than the substrate 10. Accordingly, even if the substrate 10 is made large, the vapor deposition mask 70 does not need to be made large, and therefore there is little possibility of the occurrence of a problem in that the vapor deposition mask 70 is bent or extended by its own weight. Also, the vapor deposition mask 70 and a frame or the like for holding the vapor deposition mask 70 do not need to be made big and heavy. Accordingly, vapor deposition by color can be easily performed on large-sized substrates.

Figure 8:
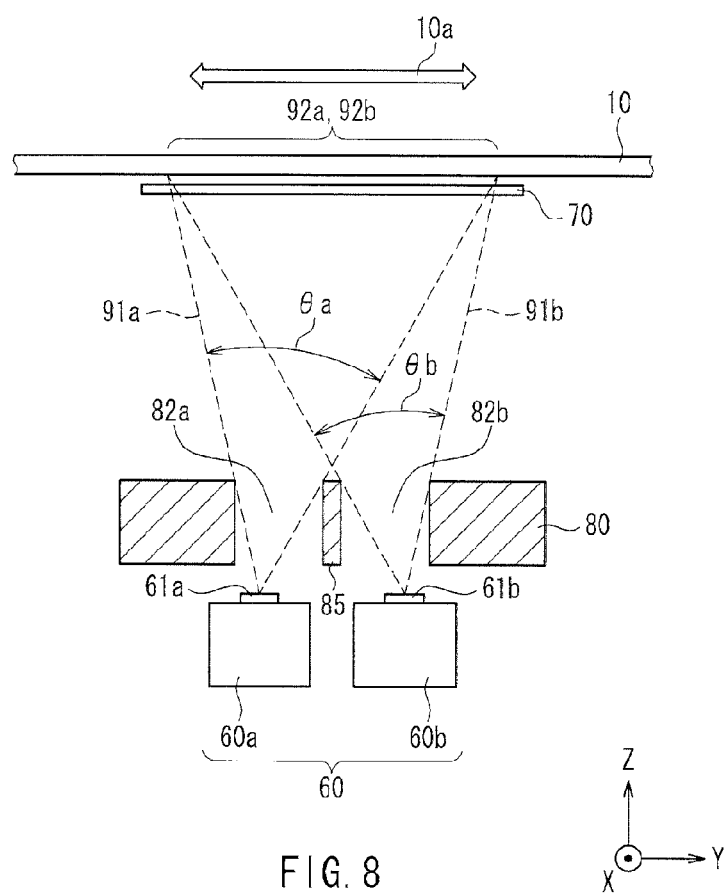
FIG. 8 is a cross-sectional view showing how a coating film is formed on the substrate in the vapor deposition device according to Embodiment 1 of the present invention, along a plane parallel to the movement direction of the substrate.

FIG. 8 is a cross-sectional view showing how a coating film 90 is formed on the substrate 10 in Embodiment 1, along a plane parallel to the movement direction 10a of the substrate 10.

The first and second vapor deposition particles 91a and 91b are discharged respectively from the first and second vapor deposition source openings 91a and 91b with certain spreads (directionalities) in the X axis direction and the Y axis direction. In Embodiment 1, the first and second vapor deposition source openings 61a and 61b open in a direction parallel to the Z axis. The number of the first and second vapor deposition particles 91a and 91b discharged from the first and second vapor deposition source openings 61a and 61b is the greatest in the opening direction (the Z axis direction in the present example) of the first and second vapor deposition source openings 61a and 61b, and gradually decreases as the angle (departure angle) formed with respect to the opening direction increases. The first and second vapor deposition particles 91a and 91b discharged from the first and second vapor deposition source openings 61a and 61b travel straight in their respective discharged direction. The first and second vapor deposition particles 91a and 91b discharged at a large departure angle collide with and are captured by the limiting plate unit 80.

As can be understood from FIG. 8, when viewed along a direction parallel to the X axis (second direction), among the first vapor deposition particles 91a discharged from the first vapor deposition source opening 61a, those that do not collide with the limiting plate unit 80 can only pass through the first limiting opening 82a. Similarly, among the second vapor deposition particles 91b discharged from the second vapor deposition source opening 61b, those that do not collide with the limiting plate unit 80 can only pass through the second limiting opening 82b. In FIG. 8, the flows (vapor deposition particle flows) of the first and second vapor deposition particles 91a and 91b that respectively have passed through the first and second limiting openings 82a and 82b are shown by dashed lines. In this manner, the limiting plate unit 80 limits the directionalities of the first and second vapor deposition particles 91a and 91b in the Y axis direction that are discharged from the first and second vapor deposition source openings 61a and 61b and travel to the substrate. Here, on a projection onto the YZ plane, "directionalities in the Y axis direction" of the first and second vapor deposition particles 91a and 91b are defined by spread angles (efflux angles) θa and θb of the flows (vapor deposition particle flows) of the first and second vapor deposition particles 91a and 91b traveling from the first and second vapor deposition source openings 61a and 61b to the substrate 10.

In the present embodiment, if a region on the substrate 10 to which the first vapor deposition particles 91a that have passed through the first limiting opening 82a adhere if the vapor deposition mask 70 is assumed not to exist is denoted by a first region 92a, and a region on the substrate 10 to which the second vapor deposition particles 91b that have passed through the second limiting opening 82b adhere if the vapor deposition mask 70 is assumed not to exist is denoted by a second region 92b, the position of the first region 92a in the Y axis direction substantially coincides with the position of the second region 92b in the Y axis direction, as viewed along the X axis direction. In other words, each portion of the limiting plate unit 80 is configured and the relative positions of the limiting plate unit 80 with respect to the first and second vapor deposition source openings 61a and 61b and the substrate 10 are set such that the first region 92a substantially coincides with the second region 92b. Moreover, a portion, or preferably the entirety of each mask opening 71 is formed within a region on the vapor deposition mask 70 corresponding to the region where the first region 92a and the second region 92b overlap on each other.

In the present embodiment, the first region 92a to which the first vapor deposition particles 91 adhere substantially coincides with the second region 92b to which the second vapor deposition particles 91b adhere, and therefore it is possible to form a coating film 90 which has a uniform mixing ratio between the first vapor deposition particles 91a and the second vapor deposition particles 92b in the thickness direction. This will be described in detail below using a comparative example.

Figure 9A:
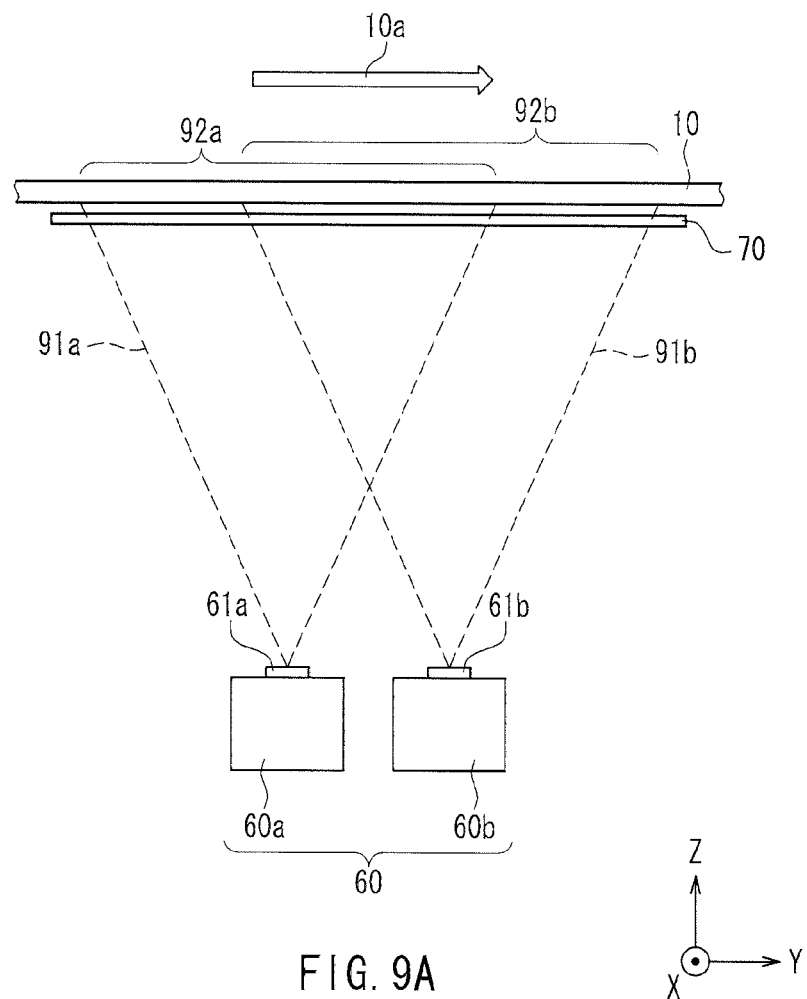
FIG. 9A is a cross-sectional view of a vapor deposition device according to a comparative example in which the limiting plate unit is omitted in the vapor deposition device shown in FIG. 5, along a plane parallel to the movement direction of the substrate.

FIG. 9A is a cross-sectional view, similarly to FIG. 8, showing a vapor deposition device according to a comparative example in which the limiting plate unit 80 is omitted in Embodiment 1. The limiting plate unit 80 is not present, and thus the first and second vapor deposition particles 91a and 91b discharged from the first and second vapor deposition source openings 61a and 61b with certain spreads (directionalities) travel straight along their respective discharged directions and reach the substrate 10. Therefore, the first region 92a on the substrate 10 to which the first vapor deposition particles 91 adhere if the vapor deposition mask 70 is assumed not to exist and the second region 92b on the substrate 10 to which the second vapor deposition particles 91b adhere if the vapor deposition mask 70 is assumed not to exist are positionally offset in the Y axis direction as shown in FIG. 9A, and overlap on each other.

Figure 9B:
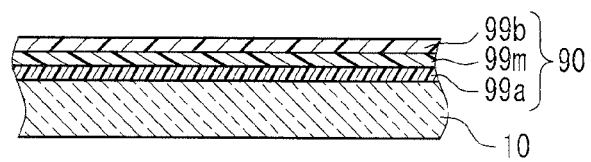
FIG. 9B is a cross-sectional view of the coating film formed on the substrate by the vapor deposition device shown in FIG. 9A.

FIG. 9B is an enlarged cross-sectional view of in the thickness direction of the coating film 90 formed on the substrate 10 when the substrate 10 is moved in the direction indicated by the arrow 10a parallel to the Y axis in FIG. 9A. As shown in FIG. 9A, the first region 92a and the second region 92b are positionally offset, and therefore firstly only the first vapor deposition particles 91a adhere to the substrate 10 so as to form a first material layer 99a, then the first vapor deposition particles 91a and the second vapor deposition particles 91b are mixed and adhere thereto so as to form a mixing layer 99m, and finally only the second vapor deposition particles 91b adhere thereto so as to form a second material layer 99b. For example, in the case where a material of the first vapor deposition particles 91a is a host and a material of the second vapor deposition particles 91b is a dopant, only the dopant is present at a high concentration in the second material layer 99b. If such a three-layer-structured coating film 90 is used as a light emitting layer for an organic EL element, carriers are prevented from moving, or the voltage is increased abnormally by the second material layer 99b, as a result of which the characteristics of the organic EL element become unstable or deteriorate. Therefore, an organic EL display device that has excellent reliability and display quality cannot be obtained.

In FIG. 9A, if the mask opening 71 is formed in a region on the vapor deposition mask 70 corresponding to the region where the first region 92a and the second region 92b overlap on each other, the first material layer 99a and the second material layer 99b shown in FIG. 9B are not formed, and it is possible to form a coating film 90 constituted only by a mixing layer 99m which has a uniform mixing ratio between the first vapor deposition particles 91a and the second vapor deposition particles 91b in the thickness direction. However, in this case, among the first region 92a and the second region 92b, a region other than the region where the first region 92a and the second region 92b overlap needs to be shielded by the vapor deposition mask 70, and therefore the size of the vapor deposition mask 70 increases. Therefore, the possible problem of the vapor deposition mask 70 being bent or extended by its own weight, the sizes and the weights of the vapor deposition mask 70 and a frame or the like for holding the vapor deposition mask 70 increasing, or the like occurs.

In contrast, in the present embodiment, as shown in FIG. 8, the limiting plate unit 70 is disposed between the first and second vapor deposition source openings 61a and 61b and the vapor deposition mask 70, and the directionalities of the first and second vapor deposition particles 91a and 91b in the Y axis direction traveling to the substrate 10 are limited by using the limiting plate unit 70. Accordingly, the first region 92a to which the first vapor deposition particles 91a adhere is caused to coincide with the second region 92b to which the second vapor deposition particles 91b adhere, without blocking unnecessary first and second vapor deposition particles 91a and 91b with the vapor deposition mask 70. As a result, it is possible to easily form the coating film 90 which has a uniform mixing ratio between the first vapor deposition particles 91a and the second vapor deposition particles 91b in the thickness direction without increasing the size of the vapor deposition mask 70. Therefore, if the light emitting layers 23R, 23G and 23B are formed according to Embodiment 1, it is possible to form an organic EL element whose luminescence property and electric current characteristics are improved and stable, and therefore a large-sized organic EL display device that has excellent reliability and display quality can be obtained.

As can be understood from the above description, in the Embodiment 1, it is important for the first region 92a on the substrate 10, to which the first vapor deposition particles 91a adhere if the vapor deposition mask 70 is assumed not to exist, and the second region 92b on the substrate 10, to which the second vapor deposition particles 91b adhere if the vapor deposition mask 70 is assumed not to exist, to be caused to substantially coincide with each other by limiting the directionalities in the Y axis direction of the first and second vapor deposition particles 91a and 91b traveling to the substrate 10 by using the limiting plate unit 80. The present invention encompasses a case in which the first region 92a and the second region 92b that substantially coincide with each other when the vapor deposition mask 70 does not exist are further limited in the Y axis direction by the mask opening 71 of the vapor deposition mask 70. Note that unless explicitly mentioned otherwise, in the present example and description below, in order to simplify the description, it is assumed that the opening dimension of the mask opening 71 in the Y axis direction is sufficiently large, and thus the vapor deposition mask 70 does not limit the vapor deposition particle flow in the Y axis direction. However, the present invention is not limited to this.

Next, the functions of the limiting plates 81a and 81b of the limiting plate unit 80 will now be described.

Figure 10:
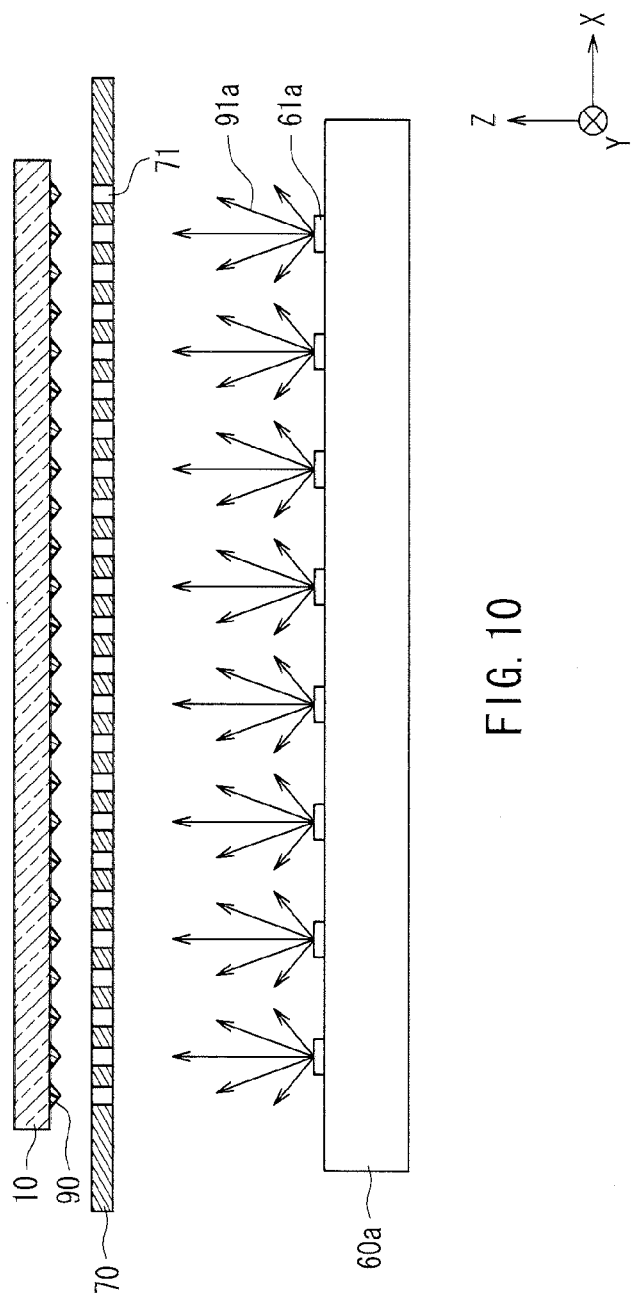
FIG. 10 is a front cross-sectional view of a vapor deposition device according to a comparative example in which the limiting plate unit is omitted in the vapor deposition device shown in FIG. 5.

FIG. 10 is a cross-sectional view of a vapor deposition device according to a comparative example in which the limiting plate unit 80 is omitted in the vapor deposition device of Embodiment 1, which is shown similarly to FIG. 6. As described above, first vapor deposition particles 91a are discharged from each first vapor deposition source opening 61a with a certain spread (a directionality) as well as in the X axis direction. In FIG. 10, the flows of the first vapor deposition particles 91a discharged from the first vapor deposition source openings 61a are conceptually indicated by arrows. The length of the arrows corresponds to the number of first vapor deposition particles 91a. Accordingly, each mask opening 71 mostly receives, but not necessarily limited thereto, the first vapor deposition particles 91a discharged from the first vapor deposition source opening 61a located directly below the mask opening 71 and also receives the first vapor deposition particles 91a discharged from the first vapor deposition source openings 61a located obliquely downward.

Figure 11:
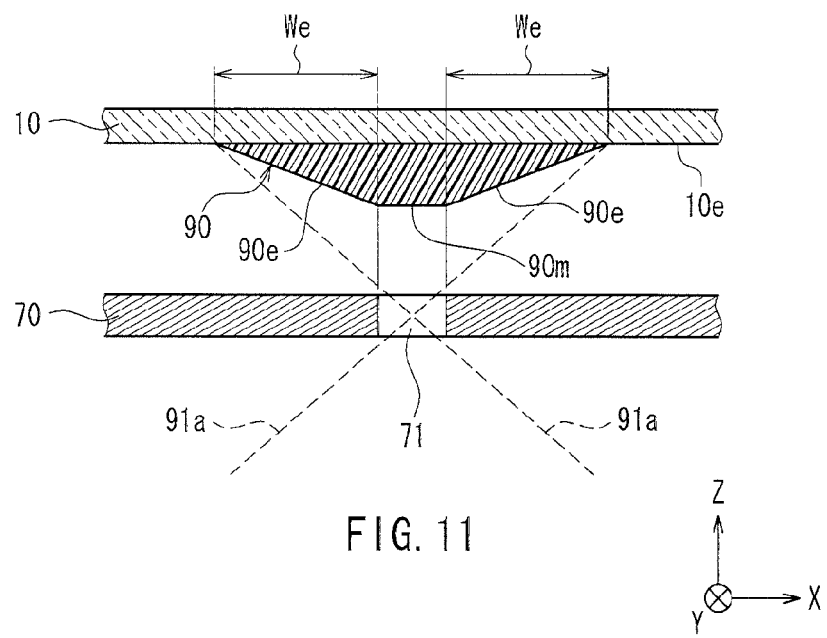
FIG. 11 is a cross-sectional view illustrating the cause of blurring generated at both edges of a coating film.

FIG. 11 is a cross-sectional view of a coating film 90 formed on a substrate 10 with first vapor deposition particles 91a that have passed through a mask opening 71 in the vapor deposition device of FIG. 10, as viewed from a direction parallel to the Y axis as in FIG. 10 It is necessary to move the substrate 10 relative to the vapor deposition mask 70, and therefore there is a gap between the substrate 10 and the vapor deposition mask 70. In this state, as described above, the first vapor deposition particles 91a coming from various directions pass through the mask opening 71. The number of first vapor deposition particles 91a that reach a deposition surface 10e of the substrate 10 is the greatest in a region directly above the mask opening 71 and gradually decreases as the position gets farther away therefrom. Accordingly, as shown in FIG. 11, on the deposition surface 10e of the substrate 10, a coating film main portion 90m having a large and substantially constant thickness is formed in the region where the mask opening 71 is projected onto the substrate 10 from directly above, and blurred portions 90e that are gradually thinner as the position gets farther away from the coating film main portion 90m are formed on both sides of the coating film main portion 90m. Then, the blurred portions 90e cause blur at the edge of the coating film 90.

In order to reduce the width We of the blurred portion 90e, a space between the vapor deposition mask 70 and the substrate 10 needs only be reduced. However, because it is necessary to move the substrate 10 relative to the vapor deposition mask 70, it is not possible to reduce the space between the vapor deposition mask 70 and the substrate 10 to zero.

If the blurred portion 90e extends to the neighboring light emitting layer region having a different color due to an increase in the width We of the blurred portion 90e, it causes "color mixing" or degradation of the characteristics of the organic EL element. In order to prevent the blurred portion 90e from extending to the neighboring light emitting layer region having a different color, so as to not cause color mixing, it is necessary to reduce the opening width of pixels (the pixels referring to the sub-pixels 2R, 2G and 2B shown in FIG. 2) or to increase the pixel pitch so as to increase the non-light-emitting region. However, if the opening width of the pixels is reduced, the light-emitting region will be small, causing a reduction in brightness. If the current density is increased in order to obtain the required brightness, the organic EL element will have a short service life and easily be damaged, causing a reduction in reliability. If, on the other hand, the pixel pitch is increased, display of high definition images cannot be achieved, reducing the quality of display.

In contrast, in Embodiment 1, as shown in FIG. 6, the limiting plate unit 80 is provided between the first vapor deposition source 60a and the vapor deposition mask 70.

Figure 12:
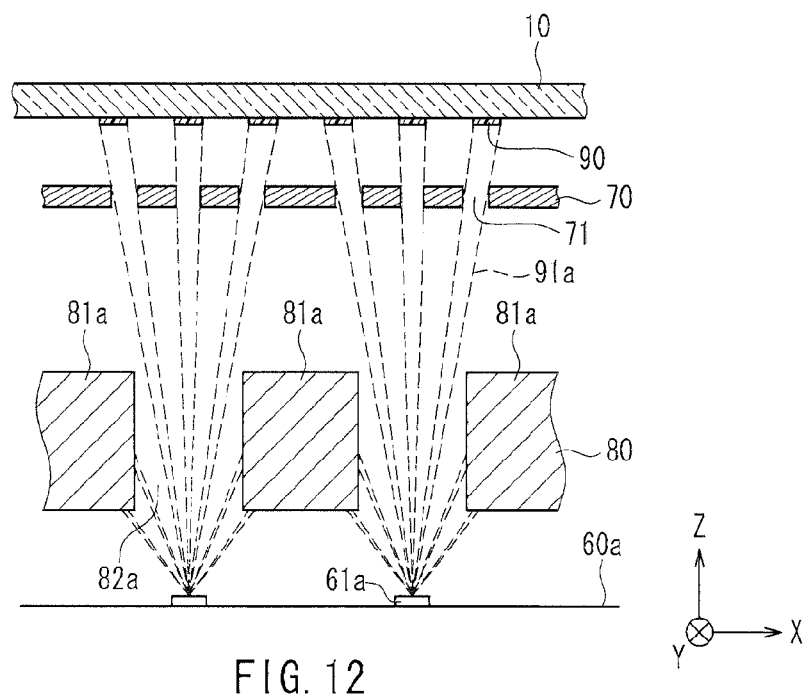
FIG. 12 is a cross-sectional view showing how the coating film is formed on the substrate in the vapor deposition device according to Embodiment 1 of the present invention, along a plane orthogonal to the movement direction of the substrate.

FIG. 12 is a cross-sectional view showing how the coating film 90 is formed on the substrate 10 in Embodiment 1, along the plane parallel to the XZ plane. In the present example, one first vapor deposition source opening 61a is disposed for one first limiting opening 82a, and the first vapor deposition source opening 61a is disposed at the central position of a pair of first limiting plates 81a neighboring in the X axis direction. The representative flight pathways of the first vapor deposition particles 91a discharged from the first vapor deposition source openings 61a are indicated by dashed lines. Among the first vapor deposition particles 91a discharged from the first vapor deposition source opening 61a with a certain spread (a directionality), those passing through the first limiting opening 82a directly above the first vapor deposition source opening 61a and then passing through the mask opening 71 adhere to the substrate 10 so as to form the coating film 90. On the other hand, the first vapor deposition particles 91a having a large velocity vector component in the X axis direction collide with and adhere to first limiting plates 81a that define the first limiting opening 82a, and therefore cannot pass through first limiting spaces 82a and cannot reach the mask openings 71.

In this manner, the first limiting plates 81a limit the incidence angles of the first vapor deposition particles 91a entering the mask openings 71 (or the substrate 10). As used herein, "incidence angle in the X axis direction" of the first vapor deposition particles 91a with respect to the mask opening 71 (or the substrate 10) is defined as the angle formed between the flight direction of the first vapor deposition particles 91a entering the mask opening 71 (or the substrate 10) and the Z axis on a projection onto the XZ plane.

In this manner, the plurality of first limiting plates 81a of the limiting plate unit 80 improve the directionality of the first vapor deposition particles 91a in the X axis direction entering the substrate 10. Therefore, the width We of the blurred portion 90e resulting from the first vapor deposition particles 91a can be reduced.

In the present embodiment, all of the first vapor deposition particles 91a incident to each mask opening 71 are discharged only from the same first vapor deposition source opening 61a. In other words, first vapor deposition particles 91a discharged from different vapor deposition source openings 61a do not enter the same mask opening 71. Accordingly, the width We of the blurred portion 90e can be further reduced.

The above description described the function of the first limiting plates 81a with respect to the first vapor deposition particles 91a discharged from the first vapor deposition source openings 61a similarly holds true for the function of the second limiting plates 81b with respect to the second vapor deposition particles 91b discharged from the second vapor deposition source openings 61b. Therefore, the width We of the blurred portion 90e resulting from the second vapor deposition particles 91b can be similarly reduced. Also, the first vapor deposition particles 91a and the second vapor deposition particles 91b adhere to the same region on the substrate 10 in the X axis direction. In other words, a coating film formed by the first vapor deposition particles 91a and a coating film formed by the second vapor deposition particles 91b are not positionally offset in the X axis direction on the substrate 10. Therefore, blurring at both edges of the coating film 90 in the X axis direction caused by positional offsetting between both coating films does not occur.

As described above, according to Embodiment 1, even if the substrate 10 and the vapor deposition mask 70 are spaced apart, the width We of the blurred portion 90e at the edge of the coating film 90 to be formed on the substrate 10 can be reduced. Therefore, vapor deposition by color for forming light emitting layers 23R, 23G and 23B using Embodiment 1 can prevent color mixing from occurring. Accordingly, the pixel pitch can be reduced, and in this case, it is possible to provide an organic EL display device that is capable of displaying high definition images. Meanwhile, the light-emitting region may be enlarged without changing the pixel pitch, and in this case, it is possible to provide an organic EL display device that is capable of displaying high definition images. Also, because it is not necessary to increase the current density in order to increase the brightness, the organic EL element does not have a short service life and is not easily damaged, and a reduction in reliability can be prevented.

In Embodiment 1, the plurality of first limiting openings 82a and the plurality of second limiting openings 82b are formed in the shared limiting plate unit 80. Therefore, the size and the weight of the entire limiting plate unit 80 can be reduced, and the operation for replacing the limiting plate unit 80 is easily performed when a vapor deposition material has adhered to the limiting plate unit 80 or the like. Thus, the losses resulting from a stop of production are reduced and the throughput at the time of mass production is improved. Also, the frequency at which the limiting plate unit 80 is replaced can be increased, and therefore the limiting plate unit 80 can be always kept in a clean state in which only a small amount of a vapor deposition material adheres thereto. Therefore, the first and second vapor deposition particles 91a and 91b that collide with the limiting plate unit 80 can be reliably captured, and it is possible to suppress the re-vaporization of the captured first and second vapor deposition particles 91a and 91b. As a result, the flight directions of the first and second vapor deposition particles 91a and 91b can be stably controlled, and therefore the accuracy in the patterning of the coating film 90 is improved.

If the position of the limiting plate unit 80 in the Z axis direction is appropriately set, the dimension of the limiting plate unit 80 in the Z axis direction can be reduced. In this case, the size and the weight of the limiting plate unit 80 can be further reduced.

In the above-described example, one first vapor deposition source opening 61a is disposed at the center of first limiting plates 81a neighboring in the X axis direction. Also, one second vapor deposition source opening 61b is disposed at the center of second limiting plates 81b neighboring in the X axis direction. Therefore, one first vapor deposition source opening 61a corresponds to one first limiting opening 82a, and one second vapor deposition source opening 61b corresponds to one second limiting opening 82b. However, the present invention is not limited to this. For example, a plurality of first limiting openings 82a may be configured to correspond to one first vapor deposition source opening 61a. Similarly, a plurality of second limiting openings 82b may be configured to correspond to one second vapor deposition source opening 61b. Alternatively, one first limiting opening 82a is configured to correspond to a plurality of first vapor deposition source openings 61a. Similarly, one second limiting opening 82b is configured to correspond to a plurality of second vapor deposition source openings 61b. In the present invention, "the limiting opening corresponding to the vapor deposition source opening" refers to the limiting opening that is designed to allow the passage of the vapor deposition particles discharged from the vapor deposition source opening.

As described above, in Embodiment 1, the first and second vapor deposition particles 91a and 91b respectively pass through the plurality of mask openings 71. Moreover, the distribution of the first vapor deposition particles 91a on the substrate 10 that have passed through the plurality of mask openings 71 and the distribution of the second vapor deposition particles 91b on the substrate 10 that have passed through the plurality of mask openings 71 coincide with each other in the X axis direction and the Y axis direction. Therefore, a plurality of coating films 90 which has a uniform mixing ratio between the first vapor deposition particles 91a and the second vapor deposition particles 91b in the thickness direction can be stably formed on the substrate 10.

The configuration shown in the above-described figure is merely an example of Embodiment 1. The present invention is not limited to this example, and can be appropriately changed.

Figure 13:
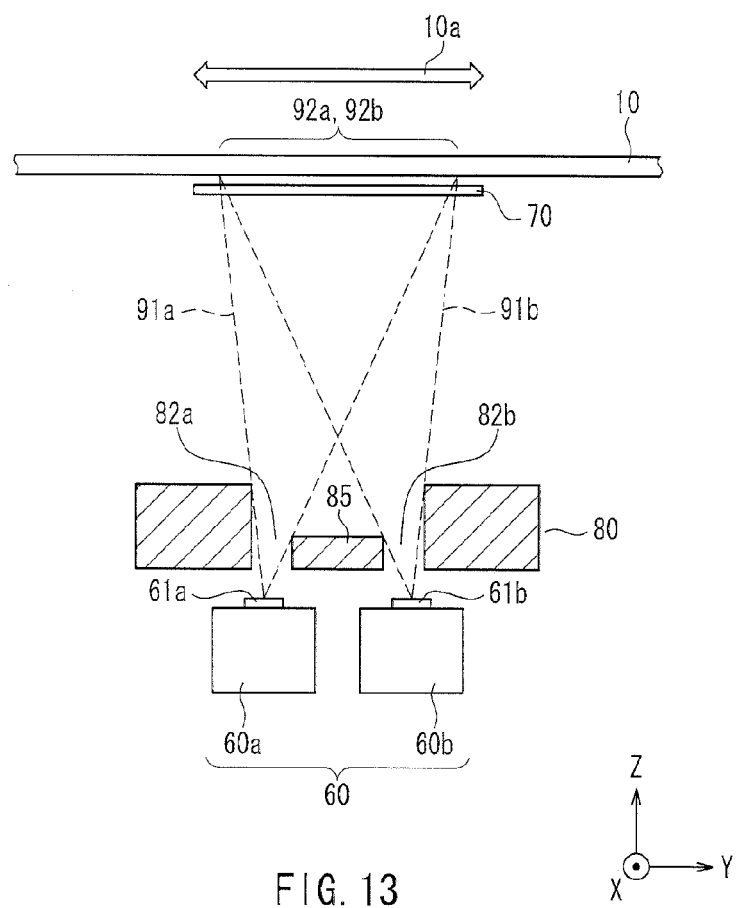
FIG. 13 is a cross-sectional view of another vapor deposition device according to Embodiment 1 of the present invention, along a plane parallel to the movement direction of the substrate.

For example, as shown in FIG. 13, the dimension of the separation plate 85 in the Y axis direction may be increased and the dimension thereof in the Z axis direction may be reduced. In this case, it is preferable to lower the upper surface (the surface on the side of the vapor deposition mask 70) of the separation plate 85 than the upper surface (the surface on the side of the vapor deposition mask 70) of portions other than the separation plate 85 of the limiting plate unit 80 in order to cause the position of the first region 92a in the Y axis direction to coincide with the position of the second region 92b in the Y axis direction.

It is possible for a cooling device for cooling the limiting plate unit 80 to be easily incorporated into the separation plate 85 by the separation plate 85 being configured as in FIG. 13.

The shape of the limiting plate unit 80 including the separation plate 85 may be changed to an arbitrary shape other than the shapes in FIGS. 8 and 13, taking into consideration the features of cooling the limiting plate unit 80 or the operability of replacement.

Figure 14:
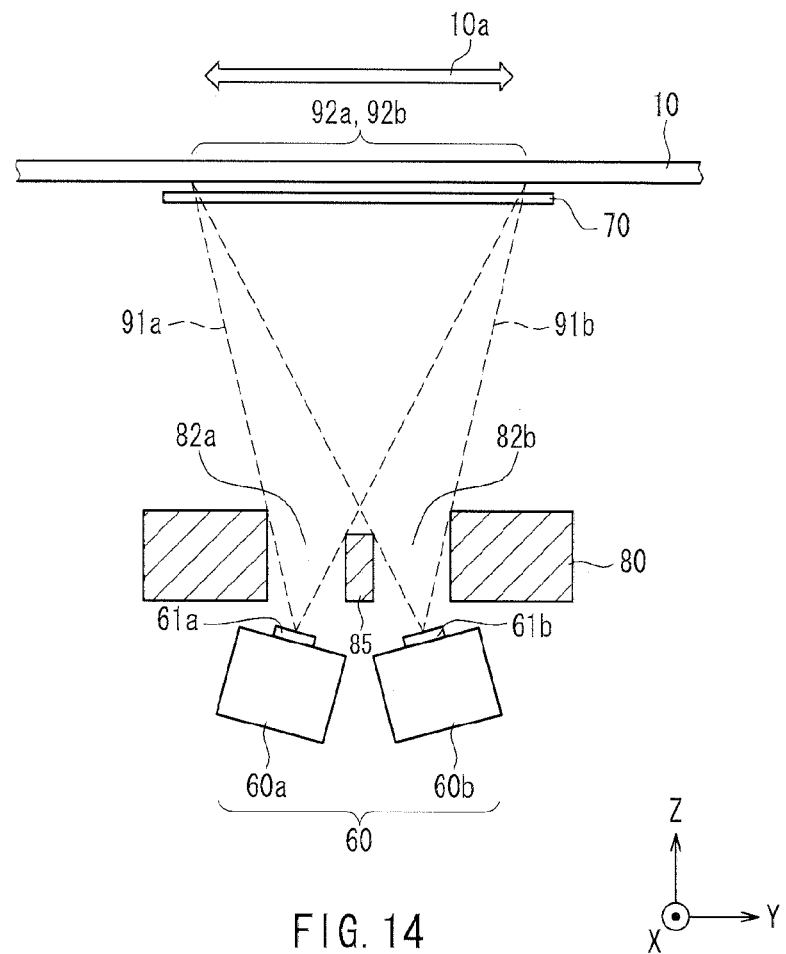
FIG. 14 is a cross-sectional view of still another vapor deposition device according to Embodiment 1 of the present invention, along a plane parallel to the movement direction of the substrate.

As shown in FIG. 14, the first vapor deposition source openings 61a and the second vapor deposition source openings 61b may be inclined such that the opening direction of the first vapor deposition source opening 61a and the opening direction of the second vapor deposition source opening 61b are tilted toward each other. The first and second vapor deposition particles 91a and 91b that collide with and are captured by the limiting plate unit 80 can be reduced by the vapor deposition source 60 being configured in this manner, and therefore the utilization efficiency of material is improved and the vapor deposition rate is also improved. Also, the amount of a vapor deposition material adhering to the limiting plate unit 80 is reduced, and therefore the frequency at which the limiting plate unit 80 is replaced is reduced and the throughput at the time of mass production is improved. Accordingly, the vapor deposition cost of the coating film 90 can be reduced. Note that either one of the first vapor deposition source opening 61a and the second vapor deposition source opening 61b may only be inclined such that the opening direction thereof is inclined toward the other opening.

Figure 15:
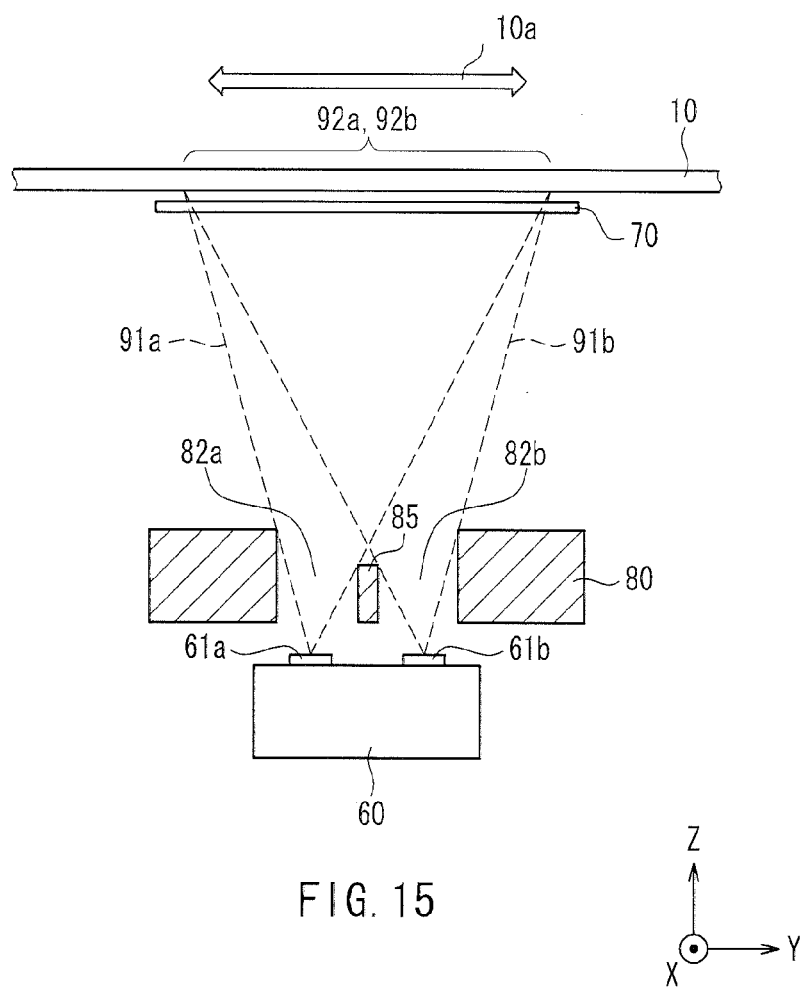
FIG. 15 is a cross-sectional view of yet another vapor deposition device according to Embodiment 1 of the present invention, along a plane parallel to the movement direction of the substrate.

As shown in FIG. 15, the first vapor deposition source 61a and the second vapor deposition source 61b may be integrated. In this configuration, the first vapor deposition source opening 61a and the second vapor deposition source opening 61b are provided in a single shared vapor deposition source 60, and the first vapor deposition source opening 61 discharges the first vapor deposition particles 91a and the second vapor deposition source opening 61b discharges the second vapor deposition particles 91b. The size of the entire vapor deposition source 60 can be reduced by the vapor deposition source 60 being configured in this manner. Also, it is not necessary to separately provide a heating device and a heat insulating device for maintaining the vapor deposition source 60 at a predetermined high temperature for the first vapor deposition source 61a and the second vapor deposition source 61b, and therefore the device cost can be reduced.

Figure 16:
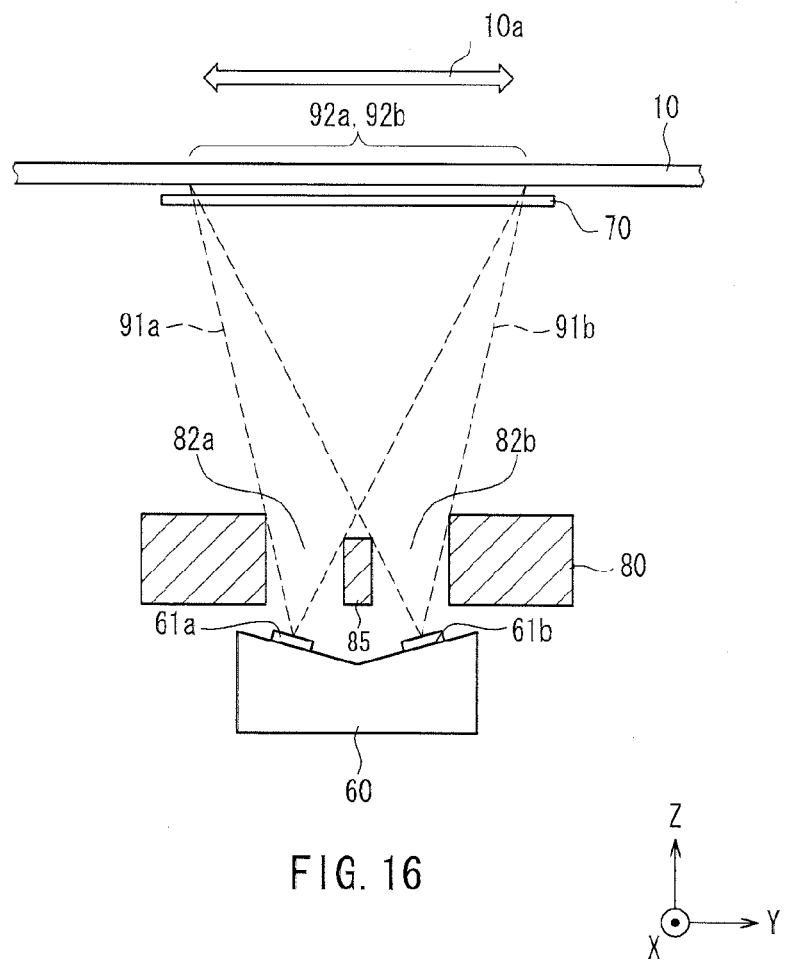
FIG. 16 is a cross-sectional view of still another vapor deposition device according to Embodiment 1 of the present invention, along a plane parallel to the movement direction of the substrate.

Furthermore, as shown in FIG. 16, a configuration may be adopted in which similarly to FIG. 15, the first vapor deposition source openings 61a and the second vapor deposition source openings 61b are provided on a shared vapor deposition source 60, and moreover they are inclined such that the opening directions thereof are tilted toward each other, similarly to FIG. 14. A vapor deposition device that has both the above-described effects resulting from the configuration of FIG. 14 and the above-described effects resulting from the configuration of FIG. 15 can be realized by the vapor deposition source 60 being configured in this manner.

Although the plurality of first vapor deposition source openings 61a and the plurality of second vapor deposition source openings 61b are arranged at the same positions at the same pitch in the X axis direction in the above-described example, the present invention is not limited to this. For example, the pitches and positions of the first vapor deposition source openings 61a and the second vapor deposition source openings 61b in the X axis direction or the number thereof may be different from each other. Similarly, although the plurality of first limiting openings 82a and the plurality of second openings 82b are arranged at the same positions at the same pitch in the X axis direction in the above-described example, the present invention is not limited to this. For example, the pitches and positions of the first limiting openings 82a and the second limiting openings 82ab in the X axis direction or the number thereof may be different from each other.

Embodiment 2

Figure 17:
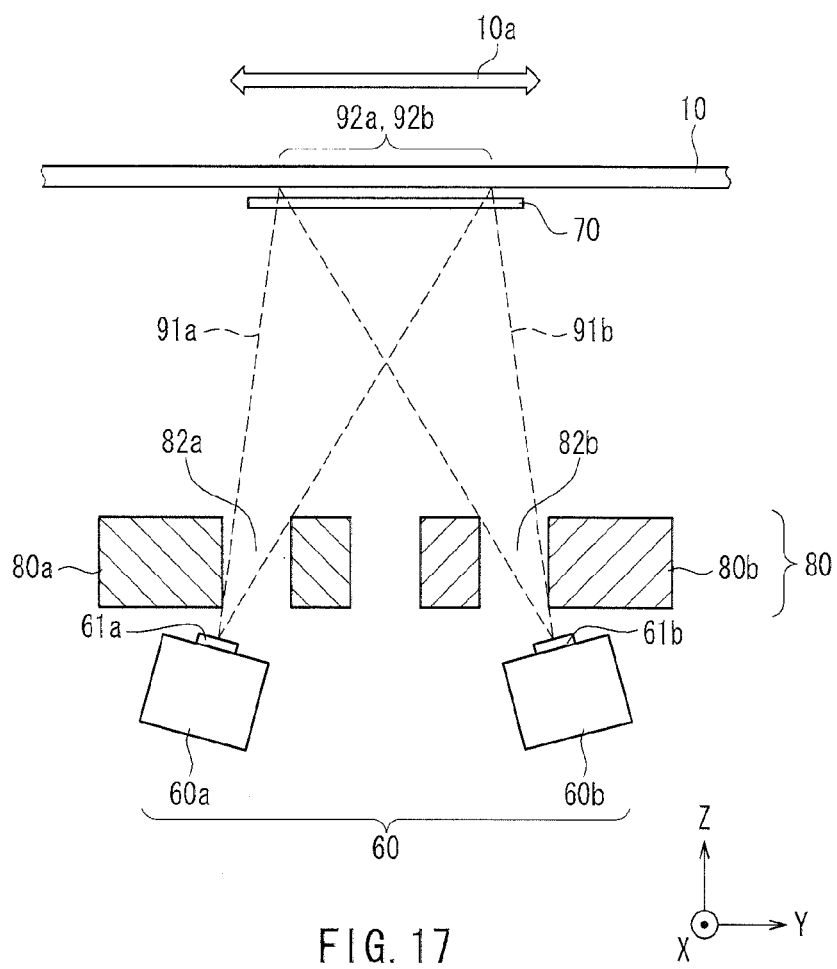
FIG. 17 is a cross-sectional view of a vapor deposition device according to Embodiment 2 of the present invention, along a plane parallel to the movement direction of a substrate.

FIG. 17 is a cross-sectional view of a vapor deposition device according to Embodiment 2, along a plane parallel to a movement direction 10a of a substrate 10. Embodiment 2 is different from Embodiment 1 in that the limiting plate unit 80 is divided into a first limiting plate unit 80a and a second limiting plate unit 80b. In Embodiment 2, the same reference numerals are given to components corresponding to the components described in Embodiment 1, and redundant description thereof will be omitted. Hereinafter, Embodiment 2 will be described, focusing on differences from Embodiment 1.

A plurality of first limiting openings 82a through which the first vapor deposition particles 91a pass are formed in the first limiting plate unit 80a along the direction parallel to the X axis direction Similarly, a plurality of second limiting openings 82b through which the second vapor deposition particles 91b pass are formed in the second limiting plate unit 80b along the direction parallel to the X axis direction. The first limiting openings 82a and the second limiting openings 82b are the same as those in Embodiment 1 in that the first limiting openings 82a and the second limiting openings 82b neighboring in the X axis direction are respectively separated from each other by the first limiting plate 81a and the second limiting plate 81b.

In Embodiment 2, the first limiting plate unit 80a and the second limiting plate unit 80b constituting the limiting plate unit 80 respectively limit the directionalities of the first vapor deposition particles 91a and the second vapor deposition particles 92b in the Y axis direction. Accordingly, similarly to Embodiment 1, when regions on the substrate 10 to which the first vapor deposition particles 91a and the second vapor deposition particles 91b respectively adhere if the vapor deposition mask 70 is assumed not to exist are respectively denoted by the first region 92a and the second region 92b, the position of the first region 92a in the Y axis direction substantially coincides with the position of the second region 92b in the Y axis direction. As a result, a similar effect to Embodiment 1, in that a coating film 90 which has a uniform mixing ratio between the first vapor deposition particles 91a and the second vapor deposition particles 91b in the thickness direction can be easily formed, is obtained.

Furthermore, in Embodiment 2, the limiting plate unit 80 is constituted by the first limiting plate unit 80a and the second limiting plate unit 80b that are independent of each other, and therefore the first limiting plate unit 80a and the second limiting plate unit 80b can be replaced separately.

For example, in the case where a material of the first vapor deposition particles 91a is the host and a material of the second vapor deposition particles 91b is the dopant, the amount of evaporation of the host is generally greater than the amount of evaporation of the dopant. Therefore, the amount of vapor deposition material adhering to the limiting plate unit 80 is higher in the host than in the dopant. The first limiting plate unit 80a and the second limiting plate unit 80b can be replaced at an appropriate timing in accordance with the amount of a vapor deposition material adhering to the limiting plate unit 80 by the limiting plate unit 80 being divided into the first limiting plate unit 80a for the first vapor deposition particles 91a and the second limiting plate unit 80b for the second vapor deposition particles 91b. For example, the first limiting plate unit 80a to which the relatively large amount of the vapor deposition material adheres can be replaced more frequently than the frequency at which the second limiting plate unit 80b.

Also, the sizes and the weights of the first limiting plate unit 80a and the second limiting plate unit 80b can be respectively reduced by dividing the limiting plate unit 80 into the first limiting plate unit 80a and the second limiting plate unit 80b. Therefore, for example, the operation for replacing only the first limiting plate unit 80a is easier than the operation for replacing the integrated limiting plate unit 80 of Embodiment 1. Thus, the losses resulting from a stop of production are reduced and the throughput at the time of mass production is improved.

In the case of recovering and re-using the vapor deposition material that has adhered to the limiting plate unit, it is difficult to separately recover the first vapor deposition particles 91a and the second vapor deposition particles 91b in Embodiment 1 because both types of vapor deposition particles have adhered to the limiting plate unit 80. In contrast, the first vapor deposition particles 91a adhere to the first limiting plate unit 80a and the second vapor deposition particles 91b adhere to the second limiting plate unit 80b in Embodiment 2. Therefore, the material of the first vapor deposition particles 91a (a first material) and the material of the second vapor deposition particles 91b (a second material) can be respectively easily recovered from the first limiting plate unit 80a and the second limiting plate unit 80b. In this manner, according to Embodiment 2, the operation for recovering a vapor deposition material in a high quality from the limiting plate unit that has been used can be easily performed in a short time. Therefore, a vapor deposition material can be easily re-used, and a vapor deposition cost can be reduced.

In FIG. 17, the first vapor deposition source opening 61a and the second vapor deposition source opening 61b are inclined such that the opening directions thereof are tilted toward each other, and therefore the utilization efficiency of material is improved and the vapor deposition rate is also improved as described in FIG. 14.

Embodiment 2 is the same as Embodiment 1 except for the above. The description of Embodiment 1 can also be applied to Embodiment 2.

Embodiment 3

Figure 18:
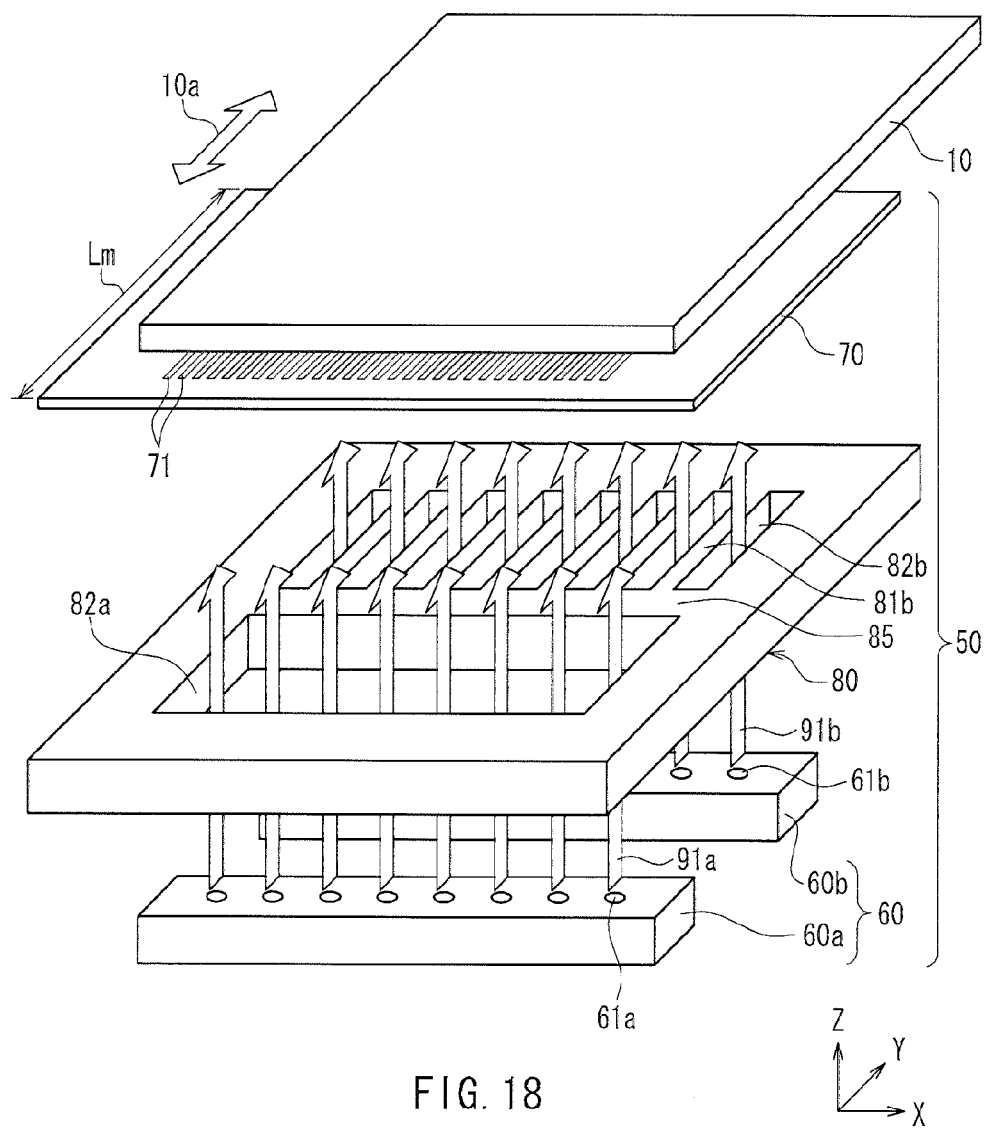
FIG. 18 is a perspective view showing the basic configuration of a vapor deposition device according to Embodiment 3 of the present invention.
Figure 19:
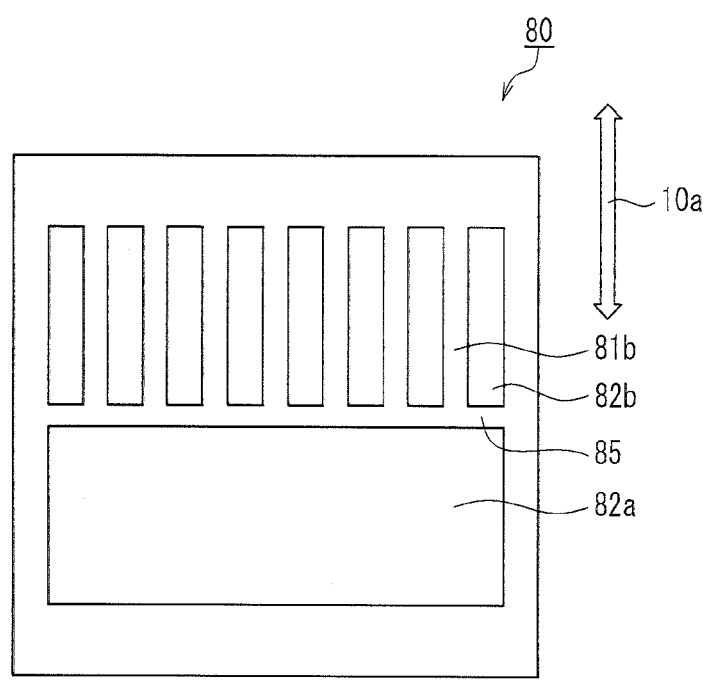
FIG. 19 is a plan view of a limiting plate unit constituting the vapor deposition device shown in FIG. 18.
Figure 19:
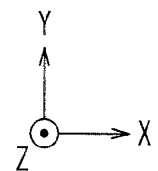

FIG. 18 is a perspective view showing the basic configuration of a vapor deposition device according to Embodiment 3. FIG. 19 is a plan view of a limiting plate unit 80 that constitutes the vapor deposition device according to Embodiment 3. Embodiment 3 is different from Embodiment 1 in the configuration of the limiting plate unit 80. Specifically, the plurality of first limiting openings 81a that are separated by the plurality of first limiting plates 81a are formed in the limiting plate unit 80 of Embodiment 1, but a single first limiting opening 82a is formed in the limiting plate unit 80 of Embodiment 3. Therefore, the first limiting plates 81a are not present in the limiting plate unit 80 of Embodiment 3. In Embodiment 3, the same reference numerals are given to components corresponding to the components described in Embodiments 1 and 2, and redundant description thereof will be omitted. Hereinafter, Embodiment 3 will be described, focusing on differences from Embodiment 1.

Figure 20:
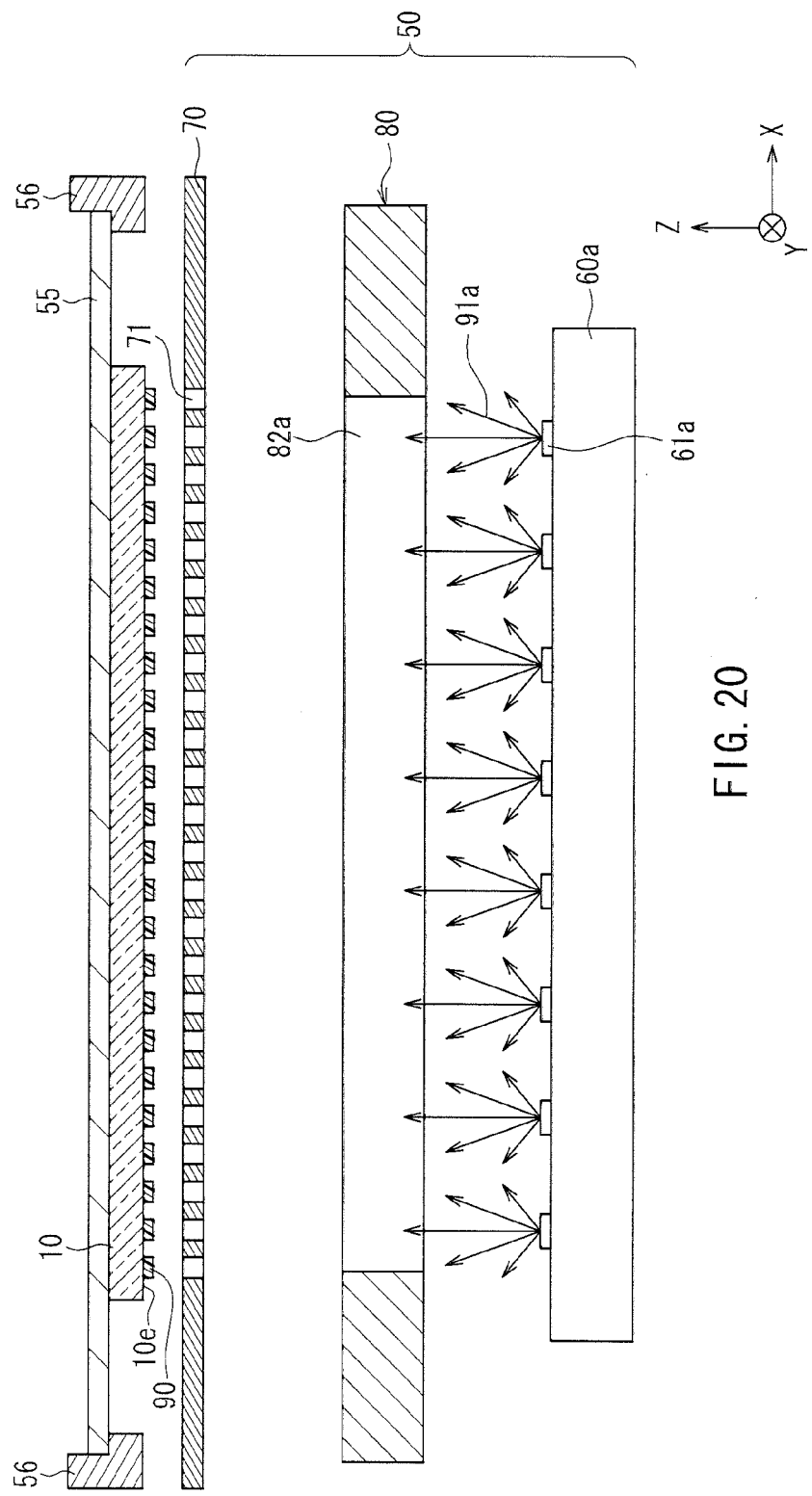
FIG. 20 is a front-cross sectional view of the vapor deposition device shown in FIG. 18, along a plane that is perpendicular to the traveling direction of the substrate and passes across first vapor deposition source openings.

FIG. 20 is a front-cross sectional view of the vapor deposition device of Embodiment 3, along a plane that passes across first vapor deposition source openings. As described in Embodiment 1, the first vapor deposition particles 91a are discharged from each of the plurality of first vapor deposition source openings 61a with a certain spread (a directionality). Unlike Embodiment 1, the first limiting plates 81a that limit the incidence angles of the first vapor deposition particles 91a with respect to the mask openings 71 are not present in the first limiting opening 82a through which the first vapor deposition particles 91a pass in Embodiment 3. Therefore, a greater amount of the first vapor deposition particles 91a discharged from the first vapor deposition source openings 61a enter each mask opening 71 than in Embodiment 1. Accordingly, the directionality of the first vapor deposition particles 91a in the X axis direction that enter the substrate 10 decreases, and the widths We (see FIG. 11) of the blurred portions 90e that are formed on both edges of the coating film 90 in the X axis direction caused by the first vapor deposition particles 91a increase.

Figure 21:
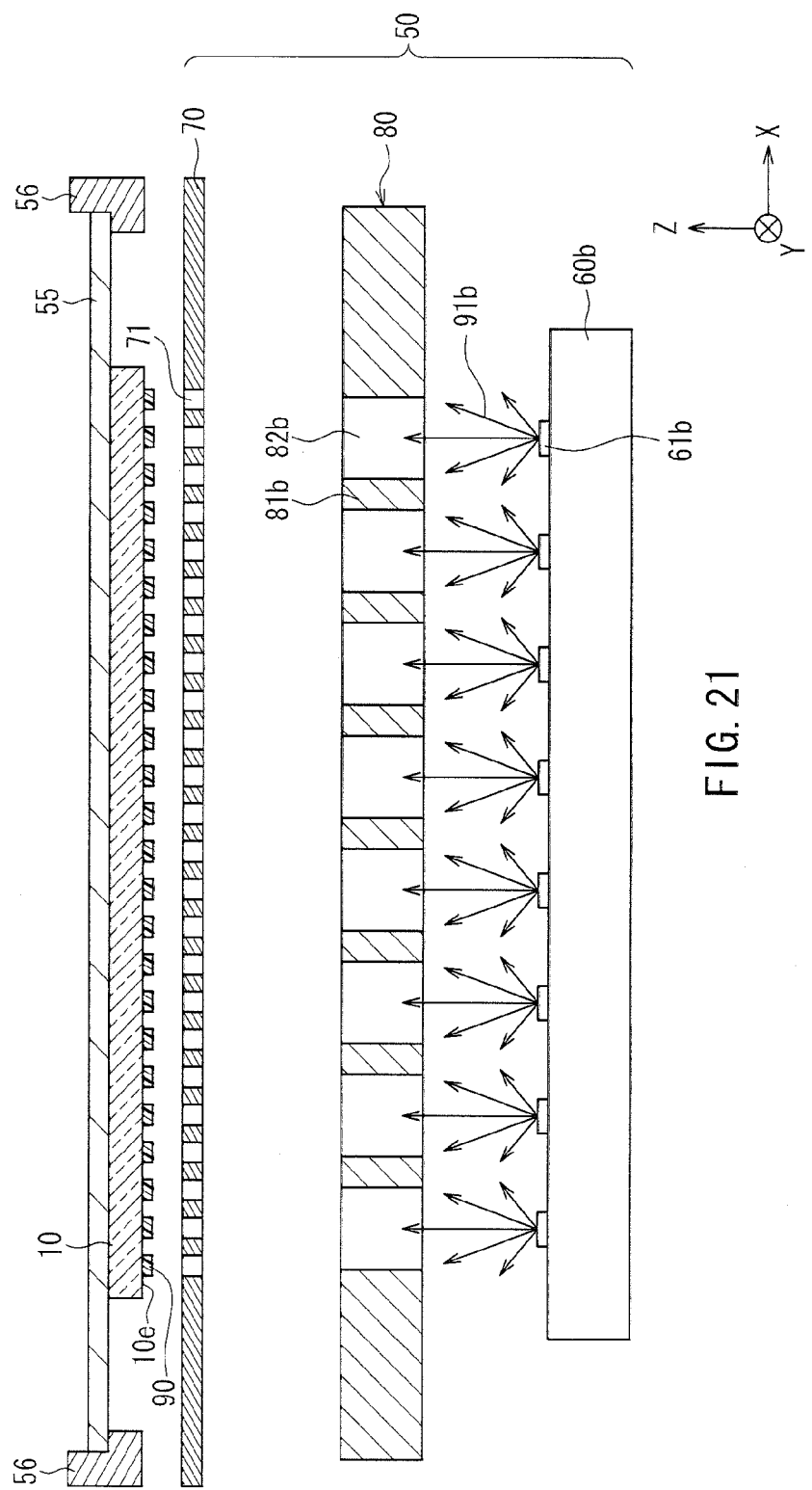
FIG. 21 is a front-cross sectional view of the vapor deposition device shown in FIG. 18, along a plane that is perpendicular to the traveling direction of the substrate and passes across second vapor deposition source openings.

FIG. 21 is a front-cross sectional view of the vapor deposition device of Embodiment 3, along a plane that passes across the second vapor deposition source openings 61b. The configuration of FIG. 21 is the same as Embodiment 1. Therefore, similarly to Embodiment 1, the second limiting plates 81b limit the incidence angles of the second vapor deposition particles 91b in the X axis direction with respect to the mask openings 71 in Embodiment 3. Accordingly, similarly to Embodiment 1, the widths We (see FIG. 11) of the blurred portions 90e caused by the second vapor deposition particles 91b can be reduced.

Therefore, in Embodiment 3, a coating film main portion 90m in which the first vapor deposition particles 91a and second vapor deposition particles 91b are mixed and adhere is formed in a region where the mask opening 71 is projected upwardly on the substrate 10 in FIG. 11 and the blurred portions 90e caused by substantially only the first vapor deposition particles 91a are formed on both sides thereof in the X axis direction. The compositions of the coating film main portion 90m and the blurred portions 90e in the thickness direction are constant. The width We of the blurred portion 90e may be greater than in Embodiment 1, and the blurred portions 90e may continue between the coating film 90 neighboring in the X axis direction.

However, in Embodiment 3, in the case where a material of the first vapor deposition particles 91a is the host and a material of the second vapor deposition particles 91b is the dopant, it is possible to realize a high definition organic EL display device that does not produce color mixing. The reason therefor will be described below. Generally, a light emitting layer for an organic EL element emits light highly efficiently by dispersing luminescent dopants into the host. In such a organic EL element, a light emitting region of the light emitting layer substantially depends on a pattern of dopants formed by vapor deposition. Therefore, if dopants are mixed into a host in a pattern as intended, high definition light emission is possible even if a pattern of a host formed by vapor deposition protrudes beyond a pattern of dopants formed by vapor deposition.

Figure 22:
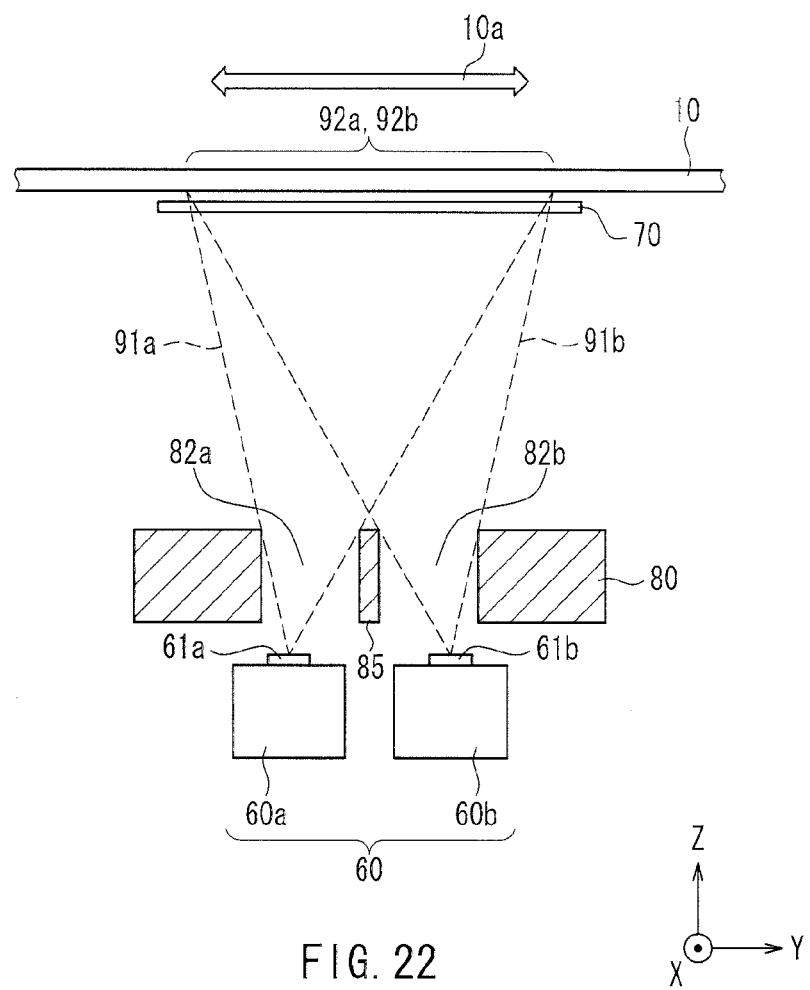
FIG. 22 is a cross-sectional view showing how a coating film is formed on a substrate in the vapor deposition device according to Embodiment 3 of the present invention, along a plane parallel to the movement direction of the substrate.

FIG. 22 is a cross-sectional view showing how the coating film 90 is formed on the substrate 10 in the vapor deposition device according to Embodiment 3, along a plane parallel to the movement direction 10a of the substrate 10. The configuration shown in FIG. 22 is the same as Embodiment 1. Therefore, the limiting plate unit 80 respectively limits the directionalities of the first vapor deposition particles 91a and the second vapor deposition particles 92b in the Y axis direction. Accordingly, similarly to Embodiment 1, the position of the first region 92a in the Y axis direction and the position of the second region 92b in the Y axis direction on the substrate 10 to which the first vapor deposition particles 91a and the second vapor deposition particles 91b respectively adhere if the vapor deposition mask 70 is assumed not to exist substantially coincide with each other. As a result, a similar effect to Embodiment 1, in that a coating film 90 which has a uniform mixing ratio between the first vapor deposition particles 91a and the second vapor deposition particles 91b in the thickness direction can be easily formed, is obtained.

As described above, it is possible to stably obtain an organic EL display device that has excellent reliability and display quality with Embodiment 3. Furthermore, Embodiment 3 achieves the following effects.

The first limiting opening 82a through which the first vapor deposition particles 91a pass is not separated by the first limiting plates 81a, and therefore the amount of the first vapor deposition particles 91a that collide with and adhere to the limiting plate unit 80 is reduced. Therefore, the productivity can be improved and the vapor deposition cost can be reduced due to the improvements of the utilization efficiency of material of the first vapor deposition particles 91a, the film formation rate, film formation distribution, and the like.

Moreover, the amount of the first vapor deposition particles 91a adhering to the limiting plate unit 80 is reduced, and therefore the frequency at which the limiting plate unit 80 is replaced because the first vapor deposition particles 91a adhere thereto can be reduced. The present embodiment is particularly effective for a case where a material of the first vapor deposition particles 91a is a host whose evaporation amount is relatively high.

In Embodiment 1, among the plurality of first vapor deposition source openings 61a, those that discharge the first vapor deposition particles 91a that enter mask openings 71 are respectively selected by the plurality of limiting plates 81a. Therefore, variation of characteristics among the plurality of first vapor deposition source openings 61a greatly affects thickness variation among the plurality of coating films 90 as well as variation of luminescence property of organic EL elements. In contrast, in Embodiment 3, a greater amount of the first vapor deposition particles 91a discharged from the first vapor deposition source openings 61a enter each mask opening 71 than in Embodiment 1. Therefore, even if there is variation of characteristics among the plurality of first vapor deposition source openings 61a, such variation is averaged and therefore thickness variation among the plurality of coating films 90 or variation of luminescence property of organic EL elements is unlikely to occur. Accordingly, it is possible to further improve the display quality and reliability of an organic EL display device.

In Embodiment 3, there is no need to improve the directionality of the first vapor deposition particles 91a in the X axis direction entering the mask opening 71. Therefore, for example, it is not necessary for the first vapor deposition source openings 61a to have a nozzle shape for improving the directionality of the first vapor deposition particles 91a. Also, the positions in the X axis direction where the first vapor deposition source openings 61a are arranged are arbitrary. Thus, for example, the first vapor deposition source openings 61a may be in the shape of a slot that has a large opening dimension in the X axis direction. A plurality of slot-shaped openings may be disposed at different positions in the X axis direction as the first vapor deposition source openings 61a, or a single slot-shaped opening may be disposed along the X axis direction (see FIG. 31 described later). With Embodiment 3, the degree of freedom in design relating to the shapes or the arrangement of the first vapor deposition source openings 61a can be improved and the film formation rate can be further improved through their conception.

Embodiment 3 is the same as Embodiment 1 except for the above. The description of Embodiment 1 can also be applied to Embodiment 3.

Furthermore, variations described in Embodiment 2 may be applied to Embodiment 3. Specifically, the limiting plate unit 80 may be divided into the first limiting plate unit 80a and the second limiting plate unit 80b, and the plurality of first limiting plates 81a are omitted in the first limiting plate unit 80a as in Embodiment 3.

Embodiment 4

Figure 23A:
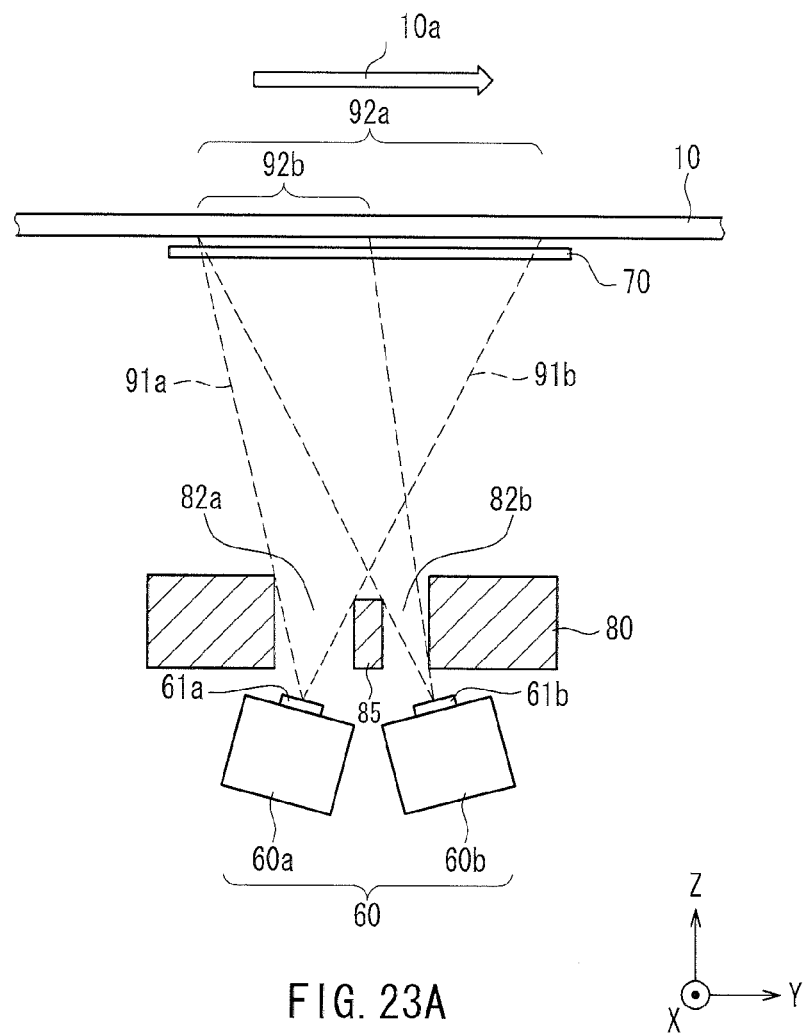
FIG. 23A is a cross-sectional view showing how a coating film is formed on a substrate in a vapor deposition device according to Embodiment 4 of the present invention, along a plane parallel to the movement direction of the substrate.

FIG. 23A is a cross-sectional view showing how a coating film is formed on a substrate 10 in a vapor deposition device according to Embodiment 4, along a plane parallel to a movement direction 10a of the substrate 10. In Embodiment 4, the same reference numerals are given to components corresponding to the components described in Embodiments 1 to 3, and redundant description thereof will be omitted. Hereinafter, Embodiment 4 will be described, focusing on differences from Embodiment 1.

As shown in FIG. 23A, in Embodiment 4, if regions on the substrate 10 to which the first vapor deposition particles 91a and the second vapor deposition particles 91b adhere if the vapor deposition mask 70 is assumed not to exist are respectively denoted by the first region 92a and the second region 92b, the first region 92a is wider than the second region 92b in the Y axis direction, as viewed along the X axis direction. More specifically, the edge position of the first region 92a and the edge position of the second region 92b coincide with each other on one side in the Y axis direction (left side in FIG. 23), and the edge of the first region 92a passes across and protrudes beyond the edge of the second region 92b on the other side in the Y axis direction (right side in FIG. 23). Each portion of the limiting plate unit 80 is configured and the relative positions of the limiting plate unit 80 with respect to the first and second vapor deposition source openings 61a and 61b and the substrate 10 are set such that the first region 92a and the second region 92b are disposed in this manner.

The substrate 10 moves in the direction indicated by the arrow 10a with respect to the vapor deposition mask 70, that is, moves in one direction from the left to the right in FIG. 23A.

Embodiment 4 is the same as Embodiment 1 except for the above.

Figure 23B:
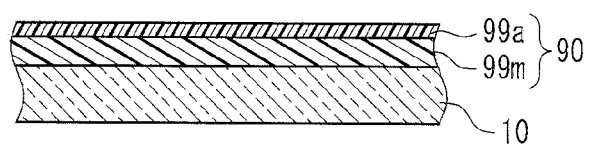
FIG. 23B is a cross-sectional view of the coating film formed on the substrate by the vapor deposition device shown in FIG. 23A.

The substrate 10 moves in one direction of the arrow 10a with respect to the above-described first region 92a and second region 92b, and therefore, as shown in FIG. 23B, it is possible to form a two-layer structured coating film 90, on the substrate 10, in which a mixing layer 99m in which the first vapor deposition particles 91a and the second vapor deposition particles 91b are mixed and adhere is first formed, and only a first material layer 99a to which the first vapor deposition particles 91a adhere is next formed. The thickness ratio between the mixing layer 99m and the first material layer 99a can be set to any arbitrary thickness ratio by changing the dimension ratio in the Y axis direction between the second region 92b and a portion of the first region 92a protruding from the second region 92b in FIG. 23A.

Various combinations are applicable to types of layers constituting the organic EL layer 27 (see FIG. 3) of the organic EL element 20, materials for each layer constituting the organic EL layer 27. For example, when a light emitting layer in which luminescent dopants are dispersed in a host is formed, a material having a good electron transport efficiency (that is, electron transportable material) may be used. Alternatively, a material having a characteristic of blocking the movement of holes (that is, hole blocking characteristic) may be used as the host.

Therefore, in the case where a material of the first vapor deposition particles 91a is the above-described host constituting the light emitting layer and a material of the second vapor deposition particles 91b is the above-described dopant constituting the light emitting layer, the mixing layer 99m shown in FIG. 23B can be used as the light emitting layer (light emitting layers 23R, 23G and 23B of FIG. 3), and the first material layer 99a can be used as an electron transport layer (electron transport layer 24 of FIG. 3) or an hole blocking layer.

In this manner, according to Embodiment 4, a light emitting layer and an electron transport layer or a hole blocking layer can be successively formed simply by moving the substrate 10 only in one direction along the movement direction 10a as shown in FIG. 23. Accordingly, the throughput at the time of mass production is improved and the productivity is improved as compared with a case where a light emitting layer and an electron transport layer or a hole blocking layer are separately formed. Also, it is not necessary to provide a vapor deposition source or a vacuum chamber for an electron transport layer or a hole blocking layer separately from a light emitting layer, and therefore the size and cost of equipment can be reduced, as a result of which an inexpensive organic EL display device can be realized.

As described above, in the case where the first electrode 21 and the second electrode 26 are respectively assumed to be a negative electrode and a positive electrode in the organic EL display device 1 as shown in FIG. 3, the light emitting layer is formed after the electron transport layer or the hole blocking layer is formed. In this case, the substrate 10 needs only to be moved in the opposite direction from the arrow 10a in FIG. 23A, that is, in one direction from the right to the left in FIG. 23A.

In FIG. 23A, the limiting plate unit 80 (see FIG. 19) described in Embodiment 3 in which the first limiting openings 82a through which the first vapor deposition particles 91a pass are not separated by the first limiting plates 81a may be used as the limiting plate unit 80. In this case, a continuous first material layer 99a (that is, an electron transport layer or a hole blocking layer) that is not separated in the X axis direction can be formed.

Figure 24A:
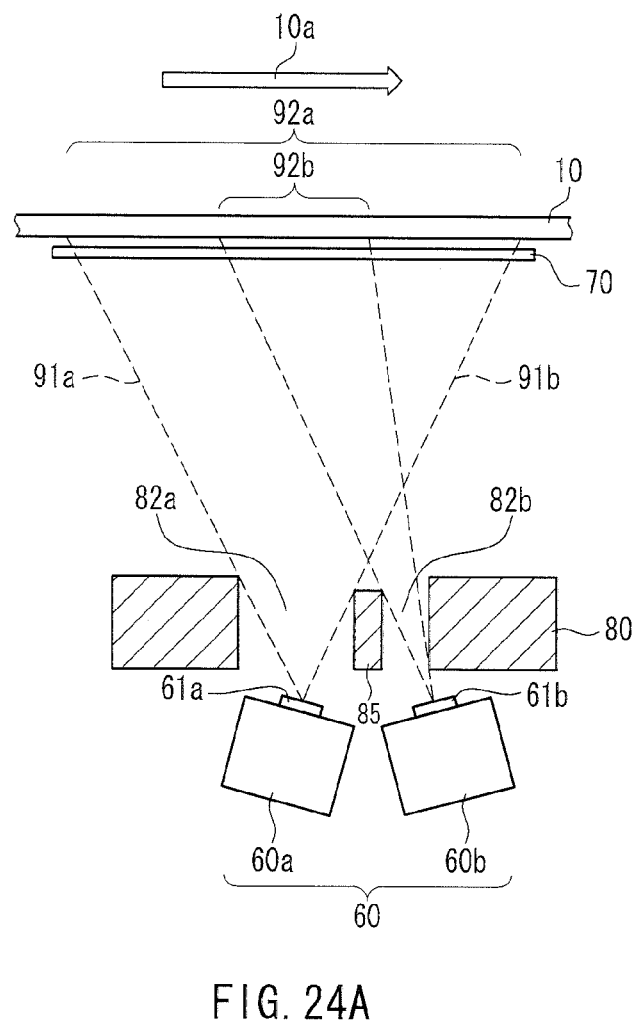
FIG. 24A is a cross-sectional view showing how a coating film is formed on the substrate in another vapor deposition device according to Embodiment 4 of the present invention, along a plane parallel to the movement direction of the substrate.
Figure 24B:
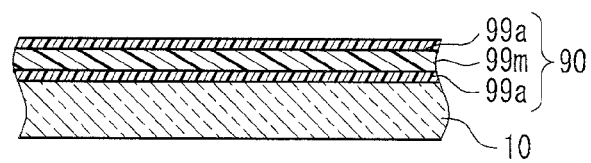
FIG. 24B is a cross-sectional view of the coating film formed on the substrate by the vapor deposition device shown in FIG. 24A.

As shown in FIG. 24A, the first region 92a may pass across the both edges of the second region 92b in the Y axis direction and protrude beyond the second region 92b in the Y axis direction. In this configuration, the substrate 10 is moved in the direction indicated by the arrow 10a with respect to the vapor deposition mask 70, that is, moves in one direction from the left to the right in FIG. 24A. Accordingly, as shown in FIG. 24B, it is possible to form a three-layer-structured coating film 90, on the substrate 10, in which the first material layer 99a to which only the first vapor deposition particles 91 adhere is first formed, the mixing layer 99m in which the first vapor deposition particles 91a and the second vapor deposition particles 91b are mixed and adhere is next formed, and the first material layer 99a to which only the first vapor deposition particles 91a adhere is finally formed. The thickness ratio between the mixing layer 99m and the first material layer 99a on both sides thereof can be set to any arbitrary thickness ratio by changing the dimension ratio in the Y axis direction between the second region 92b and each portion of the first region 92a protruding from the second region 92b on the both sides in FIG. 24A.

In FIG. 24A, the limiting plate unit 80 (see FIG. 19) described in Embodiment 3 in which the first limiting openings 82a through which the first vapor deposition particles 91a pass are not separated by the first limiting plates 81a may also be used as the limiting plate unit 80. In this case, a continuous first material layer 99a that is not separated in the X axis direction can be formed.

Note that the three-layer-structured coating film shown in FIG. 24B can also be formed by reciprocally moving the substrate 10 in the Y axis direction, using the device of FIG. 23A.

In FIGS. 23A and 24A, the first vapor deposition source opening 61a and the second vapor deposition source opening 61b are inclined such that the opening directions thereof are tilted toward each other, and therefore the utilization efficiency of material is improved and the vapor deposition rate also is improved as described in FIG. 14.

Embodiment 4 is the same as Embodiment 1 except for the above. The description of Embodiment 1 can also be applied to Embodiment 4. Furthermore, variations described in Embodiments 2 and 3 may be applied to Embodiment 4.

Embodiment 5

Embodiment 5 is suitable for forming a light emitting layer in which various types of dopants are contained in a host. FIG. 25A is a cross-sectional view showing how a coating film is formed on a substrate 10 in a vapor deposition device according to Embodiment 5, along a plane parallel to a movement direction 10a of the substrate 10. FIG. 26 is a plan view of a limiting plate unit 80 that constitutes the vapor deposition device according to Embodiment 5. In Embodiment 5, the same reference numerals are given to components corresponding to the components described in Embodiments 1 to 4, and redundant description thereof will be omitted. Embodiment 5 is different from Embodiment 1 in the configurations of the vapor deposition source 60 and the limiting plate unit 80. Hereinafter, Embodiment 5 will be described, focusing on differences from Embodiment 1.

In Embodiment 5, the vapor deposition source 60 includes a third vapor deposition source 60c in addition to the first vapor deposition source 60a and the second vapor deposition source 60b described in Embodiment 1. The third vapor deposition source 60c is disposed on the opposite of the first vapor deposition source 60a from the vapor deposition source 60b in the Y axis direction. The third vapor deposition source 60c includes a plurality of third vapor deposition source openings 61c on the upper surface thereof (that is, the surface facing the vapor deposition mask 70), similarly to the first vapor deposition source 60a and the vapor deposition source 60b. The plurality of third vapor deposition source openings 61c are arranged at a fixed pitch along a straight line parallel to the X axis direction. The plurality of third vapor deposition source openings 61c may be arranged at the same positions as the positions of the plurality of first vapor deposition source openings 61a and the plurality of second vapor deposition source openings 61b in the X axis direction. Each vapor deposition source opening 61c has a nozzle shape similar to the vapor deposition source openings 61a and 61b. The third vapor deposition source openings 61c discharge vapor made from a third material (third vapor deposition particles 91c) that serves as a material of a light emitting layer with a certain spread (a directionality) in the X axis direction and the Y axis direction toward the vapor deposition mask.

The second vapor deposition source opening 61b is inclined such that the opening direction thereof is tilted toward the first vapor deposition source opening 61a, and the third vapor deposition source opening 61c also is inclined such that the opening direction thereof is tilted toward the first vapor deposition source opening 61a.

For example, it is possible to cause vapor for a host constituting a light emitting layer (first vapor deposition particles 91a) to be discharged from the first vapor deposition source opening 61a of the first vapor deposition source 60a, vapor for a first dopant constituting a light emitting layer (second vapor deposition particles 91b) to be discharged from the second vapor deposition opening 61b of the second vapor deposition source 60b, and vapor for a second dopant constituting a light emitting layer (third vapor deposition particles 91c) to be discharged from the vapor deposition source opening 61c of the third vapor deposition source 60c. The first dopant and the second dopant are made of different materials.

A plurality of third limiting openings 82c are formed in the limiting plate unit 80 in addition to the single first limiting opening 82a and the plurality of second limiting openings 82b described in Embodiment 3. The plurality of third limiting openings 82c are arranged on the side opposite of the first limiting opening 82a from the plurality of second limiting openings 82b in the Y axis direction. The plurality of third limiting openings 82c are arranged at the same positions as the positions of the plurality of second limiting openings 82b in the X axis direction. Similarly to the plurality of second limiting openings 82b, the plurality of third limiting openings 82c are arranged at different positions in the X axis direction, and the third limiting openings 82c neighboring in the X axis direction are separated by the third limiting plates 81c. The plurality of third limiting plates 81c are arranged along the X axis direction at a fixed pitch at the same positions as the positions of the plurality of second limiting plates 81b in the X axis direction. The first limiting opening 82a and the second limiting opening 82b neighboring in the Y axis direction are separated by a first separation plate 85b, and the first limiting opening 82a and the third limiting opening 82c neighboring in the Y axis direction are separated by a second separation plate 85c.

Figure 25:
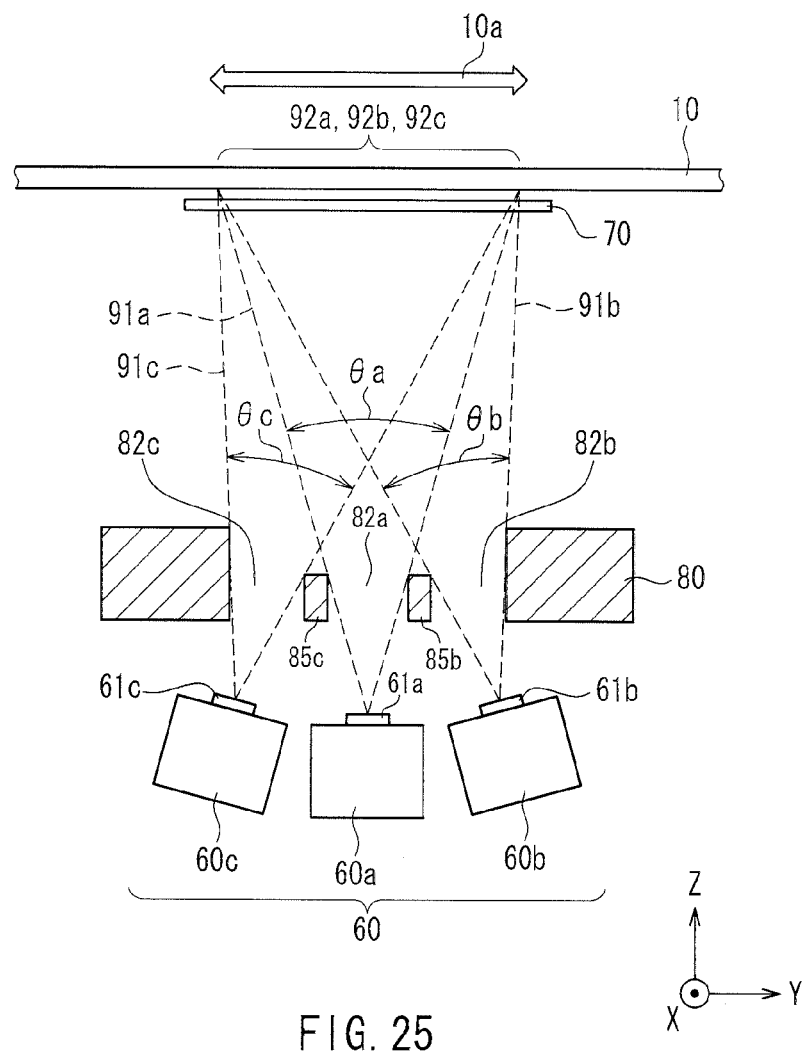
FIG. 25 is a cross-sectional view showing how a coating film is formed on a substrate in a vapor deposition device according to Embodiment 5 of the present invention, along a plane parallel to the movement direction of the substrate.

As shown in FIG. 25, on a projection onto the YZ plane, the limiting plate unit 80 respectively limits the directionalities of the first, second and third vapor deposition particles 91a, 91b and 91c in the Y axis direction such that spread angles (efflux angles) of the flows of the first, second and third vapor deposition particles 91a, 91b and 91c (vapor deposition particle flows) reach θa, θb and θc respectively. Accordingly, if regions on the substrate to which the first, second and third vapor deposition particles 91a, 91b and 91c adhere if the vapor deposition mask 70 is assumed not to exist are respectively denoted by the first region 92a, the second region 92b and the third region 92c, the positions of the first, second and third regions 92a, 92b and 92c in the Y axis direction substantially coincide with one another, as viewed along the X axis direction. In other words, each portion of the limiting plate unit 80 is configured and the relative positions of the limiting plate unit 80 with respect to the first, second and third vapor deposition source openings 61a, 61b and 61c and the substrate 10 is set such that the first region 92a, the second region 92b and the third region 92c substantially coincide with one another.

As the second limiting plate 81b limits the incidence angles of the second vapor deposition particles 91b in the X axis direction with respect to the mask opening 71, the third limiting plate 81c limits the incidence angles of the third vapor deposition particles 91c in the X axis direction with respect to the mask opening 71. Accordingly, the width We (see FIG. 11) of the blurred portion 90e caused by the third vapor deposition particles 91c can be reduced as the width We of the blurred portion 90e caused by the second vapor deposition particles 91b is reduced, as described in Embodiment 1.

Meanwhile, similarly to Embodiment 3, the first limiting plates 81a that limit the incidence angles of the first vapor deposition particles 91a in the X axis direction with respect to the mask openings 71 are not present in the first limiting opening 82a through which the first vapor deposition particles 91a pass. Therefore, similarly to Embodiment 3, the directionality of the first vapor deposition particles 91a entering the substrate 10 in the X axis direction drops, and the widths We (see FIG. 11) of the blurred portions 90e formed on both edges of the coating film 90 in the X axis direction increase.

Thus, with Embodiment 5, in FIG. 11, a coating film main portion 90m in which the first, second and third vapor deposition particles 91a, 91b and 91c are mixed is formed in a region where the mask opening 71 is projected upwardly on the substrate 10 in FIG. 11 and the blurred portions 90e caused by substantially only the first vapor deposition particles 91a are formed on both sides thereof in the X axis direction. The compositions of the coating film main portion 90m and the blurred portions 90e in the thickness direction are constant. The blurred portions 90e caused by the first vapor deposition particles 91a may continue between the coating films 90 neighboring in the X axis direction. However, as described in Embodiment 3, in the case where a material of the first vapor deposition particles 91a is a host and materials of the second and third vapor deposition particles 91b and 91c are dopants, it is possible to realize a high definition organic EL display device that does not produce color mixing.

As described above, with Embodiment 5, it is possible to stably obtain an organic EL display device that includes a light emitting layer containing two types of dopants and has excellent reliability and display quality, similarly to Embodiment 1.

Also, the first limiting openings 82a through which the first vapor deposition particles 91a pass are not separated by the first limiting plates 81a, similarly to Embodiment 3. Therefore, effects similar to the effects described in Embodiment 3 are achieved.

Furthermore, the second and third vapor deposition source openings 61b and 61c are inclined such that the opening directions thereof are tilted toward the first vapor deposition source opening 61a, and therefore, as described in FIG. 14, the utilization efficiency of material is improved and the vapor deposition rate also is improved.

Although the coating film 90 containing two types of dopants is formed in the above-described example, a coating film 90 containing three or more types of dopants can be formed by vapor deposition source openings discharging vapor for different types of dopants being further provided.

In the above-described example, similarly to Embodiment 1, the first vapor deposition source openings 61a through which the first vapor deposition particles 91a pass may be divided into a plurality of sections by the plurality of first limiting plates 81a.

The arrangements of the first, second and third vapor deposition source openings 61a, 61b and 61c in the Y axis direction are not limited to FIG. 25. The order of arrangement of the first, second and third vapor deposition source openings 61a, 61b and 61c in the Y axis direction can be arbitrarily set as long as the positions of the first, second and third regions 92a, 92b and 92c in the Y axis direction substantially coincide with one another. The order of arrangement of the first, second and third limiting spaces 81a, 81b and 81c in the Y axis direction are set in accordance with the order of arrangement of the first, second and third vapor deposition source openings 61a, 61b and 61c in the Y axis direction.

Embodiment 5 is the same as Embodiment 1 except for the above. The description of Embodiment 1 can also be applied to Embodiment 5. Also, variations described in Embodiments 2 and 3 may be applied to Embodiment 5.

Furthermore, variations described in Embodiment 4 may be applied to Embodiment 5. For example, similarly to Embodiment 4, in FIG. 25, the first region 92a may be formed so as to pass across one or both edges of the second and third regions 92b and 92c in the Y axis direction and protrude beyond the second and third regions 92b and 92c in the Y axis direction. Accordingly, it is possible to form a two-layer-structured or a third-layer-structured coating film 90 in which a first material layer made only of the first vapor deposition particles 91a is laminated on at least one surface of a mixing layer in which the first, second and third vapor deposition particles 91a, 91b and 91c are mixed and the composition of the laminated layer can vary in the thickness direction.

Embodiment 6

Figure 27A:
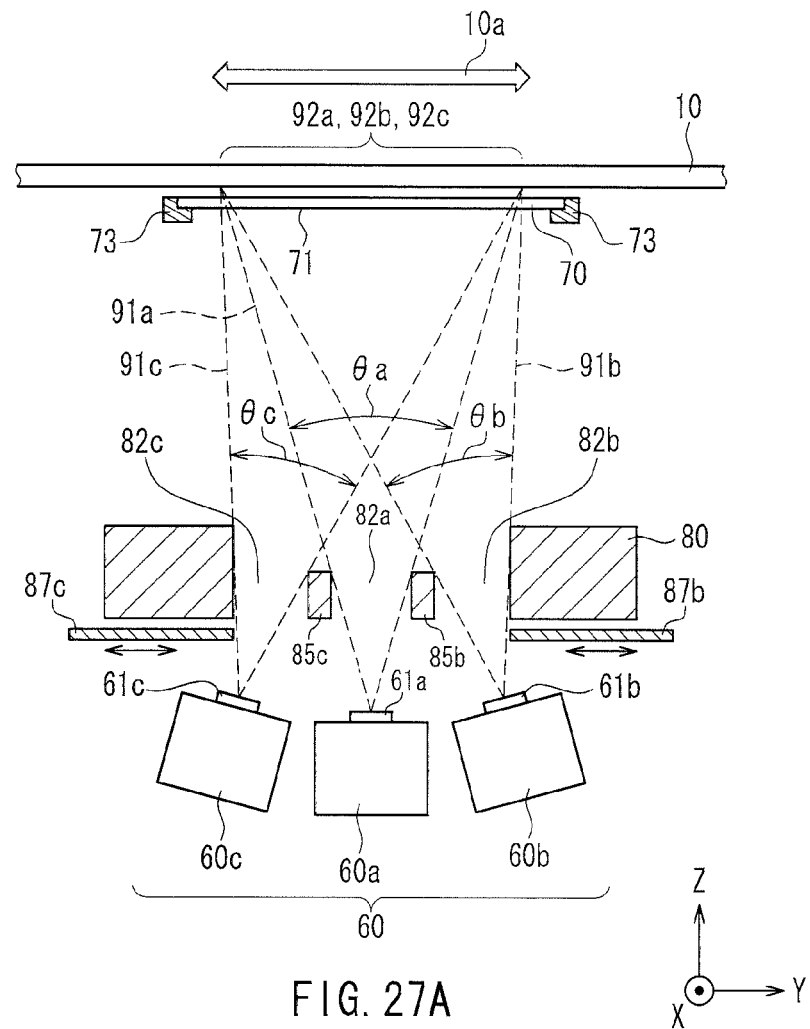
FIG. 27A is a cross-sectional view showing how a coating film is formed on a substrate in a vapor deposition device according to Embodiment 6 of the present invention, along a plane parallel to the movement direction of the substrate.

FIG. 27A is a cross-sectional view showing how a coating film is formed on a substrate 10 in a vapor deposition device according to Embodiment 6, along a plane parallel to a movement direction 10a of the substrate 10. In Embodiment 6, the same reference numerals are given to components corresponding to the components described in Embodiments 1 to 5, and redundant description thereof will be omitted.

The vapor deposition device of Embodiment 6 is different from the vapor deposition device of Embodiment 5 (see FIG. 25) in the following are tilteds.

Firstly, a first shutter 87b and a second shutter 87c are provided between the limiting plate unit 80 and the vapor deposition source 60. The first shutter 87b and the second shutter 87c can reciprocally move in the Y axis direction by a driving mechanism (not shown), and the plurality of second limiting openings 82b and the plurality of limiting openings 82c are respectively opened/closed by these shutters. The configuration of the limiting plate unit 80 is the same as in FIG. 26 described in Embodiment 5.

Secondly, the vapor deposition mask 70 can be displaced in the X axis direction by a mask shift mechanism 73. There is no particular limitation on the configuration of the mask shift mechanism 73, and any known transfer driving mechanism can be used such as a linear motor or a feed screw mechanism that rotates a feed screw by a motor.

The vapor deposition device of Embodiment 6 forms a coating film as follows.

Figure 27B:
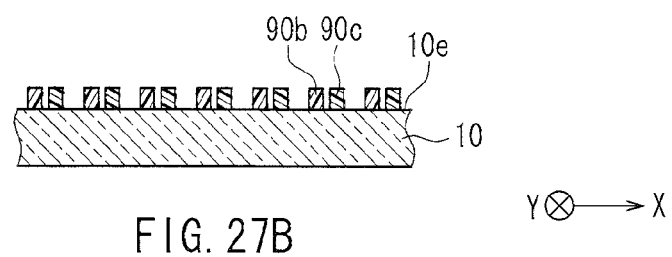
FIG. 27B is a cross-sectional view of the coating film formed on the substrate by the vapor deposition device shown in FIG. 27A, along a plane perpendicular to the movement direction of the substrate.

First, the substrate 10 is scanned (moved) along the arrow 10a from the left to the right of FIG. 27A in a state in which the first shutter 87b is opened and the second shutter 87c is closed (first scan). Accordingly, as shown in FIG. 27B, a stripe-shaped first coating film 90b in which the first vapor deposition particles 91a and the second vapor deposition particles 91b are mixed is formed on the substrate 10.

Next, the first shutter 87b is closed and the second shutter 87c is opened. Furthermore, the vapor deposition mask 70 is displaced by a predetermined amount in the X axis direction by the mask shift mechanism 73. The displacement amount of the vapor deposition mask 70 can be set to, for example, a predetermined value that is less than a pitch of the mask opening 71 in the X axis direction or an integral multiple of the predetermined value. In this state, the substrate 10 is scanned (moved) along the arrow 10a from the right to the left of FIG. 27A (second scan), opposite from the above-described first scan. Accordingly, as shown in FIG. 27B, a stripe-shaped second coating film 90c in which the first vapor deposition particles 91a and the third vapor deposition particles 91c are mixed is formed on the substrate 10. The first scan and the second scan are different from each other in the positions of the mask openings 71 of the vapor deposition mask 70 in the X axis direction, and therefore the second coating films 90c to be formed by the second scan are formed at different positions in the X axis direction with respect to the first coating films 90b formed by the first scan.

In the above-described step of forming a coating film, for example, if a host is used as a material of the first vapor deposition particles 91a, a luminescent dopant that emits red light is used as a material of the second vapor deposition particles 91b, and a luminescent dopant that emits green light is used as a material of the third vapor deposition particles 91c, a red light emitting layer 23R and a green light emitting layer 23G (see FIG. 3) can be formed by reciprocally moving the substrate 10 only once.

In the above-described example, light emitting layers in any arbitrary two colors among red, green and blue can be formed by changing the types of dopants constituting the second and third vapor deposition particles 91b and 91c.

In this manner, according to Embodiment 6, a plurality of types of coating films whose compositions are different from one another can be formed in the same vacuum chamber by sharing a vapor deposition source as a host. Moreover, the coating films can be formed only by performing a very simple operation in which for each scan of the substrate 10, the first and second shutters 87b and 87c are opened/closed and the vapor deposition mask 70 is displaced. Thus, the configuration of the vapor deposition device can be simplified. Also, a time period for vapor deposition can be shortened. Therefore, the throughput at the time of mass production is improved and the productivity is improved, as a result of which an organic EL display device can be provided at a low cost.

Although the dedicated first shutter 87b and the dedicated second shutter 87c are respectively used for the plurality of second limiting opening 82b and the plurality of third limiting openings 82c in the above-described example, a single shutter may be moved so that the plurality of second limiting openings 82b and the plurality of third limiting openings 82c are alternatively closed.

The arrangement position of a shutter is arbitrary. The flows of a plurality of types of vapor deposition particles traveling to the substrate needs only to be selectively blocked. For example, a shutter may be arranged so that the vapor deposition source openings are opened/closed.

In the above-described example, the order of forming the first and second coating films 90b and 90c is arbitrary. Also, the first and second coating films 90b and 90c may respectively be formed by for example, reciprocally moving the substrate 10, instead of moving the substrate 10 in a single direction of the reciprocal movement of the substrate 10.

In the above-described example, fourth vapor deposition source openings discharging fourth vapor deposition particles for a luminescent dopant that emits blue light may be further disposed. A plurality of the fourth limiting openings through which the fourth vapor deposition particles pass are further formed in the limiting plate unit 80. The directionality of the fourth vapor deposition particles in the Y axis direction is limited by using the limiting plate unit 80 such that a fourth region on the substrate 10 to which the fourth vapor deposition particles adhere if the vapor deposition mask 70 is assumed not to exist substantially coincides with the first to third regions 92a to 92c. It is possible to successively form the red light emitting layer 23R, the green light emitting layer 23G and the blue light emitting layer 23B (see FIG. 3) by successively opening the second, third and fourth limiting openings in an alternative manner and successively offsetting the position of the vapor deposition mask 70 in the X axis direction.

In the above-described example, in order to form coating films having different compositions on the substrate 10 at different positions in the X axis direction, the vapor deposition mask 70 is moved in the X axis direction every time the coating film having each composition is formed. However, the present invention is not limited to this, and for example, the substrate 10 may be moved in the X axis direction every time the movement (scan) of the substrate 10 in the Y axis direction for forming the coating film having each composition ends. Although there is no particular limitation on the configuration of a substrate shift mechanism for moving the substrate 10 in the X axis direction, the substrate shift mechanism can be configured similarly to the above-described mask shift mechanism 73.

Embodiment 6 is the same as Embodiment 1 except for the above. The description of Embodiment 1 can also be applied to Embodiment 6. Also, variations described in Embodiments 2 to 5 may be applied to Embodiment 6.

Embodiment 7

Figure 28:
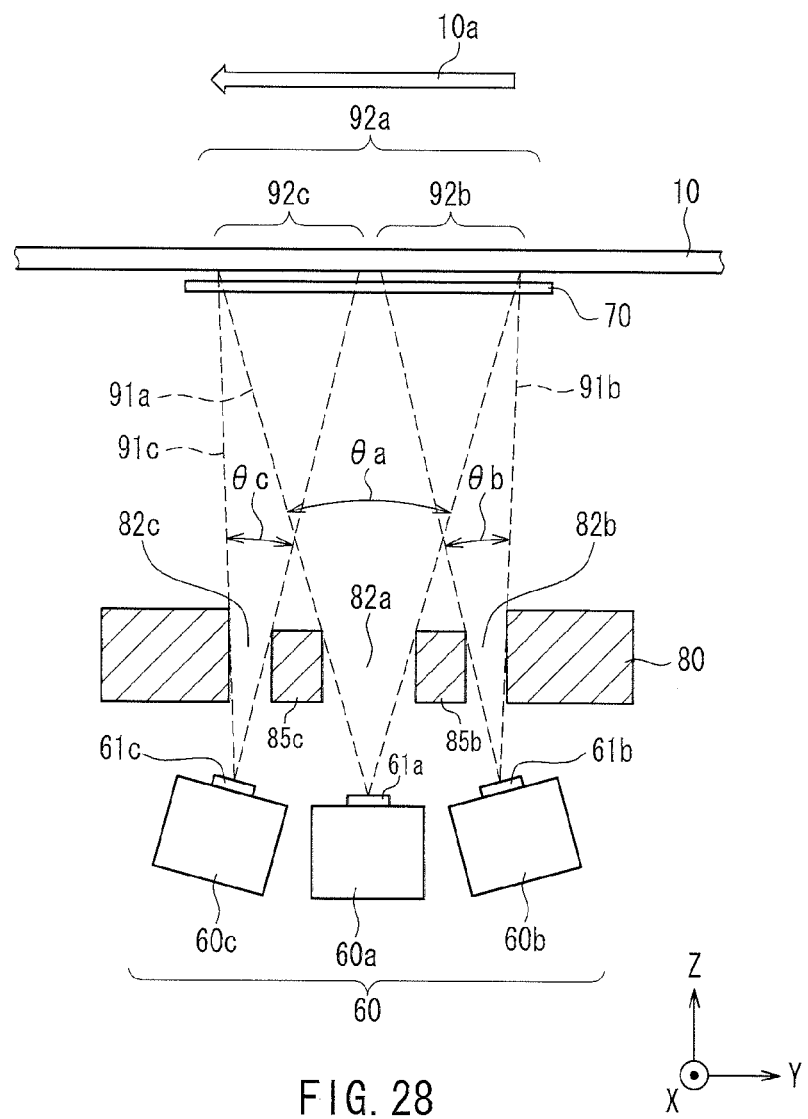
FIG. 28 is a cross-sectional view showing how a coating film is formed on a substrate in a vapor deposition device according to Embodiment 7 of the present invention, along a plane parallel to the movement direction of the substrate.

FIG. 28 is a cross-sectional view showing how a coating film is formed on a substrate 10 in a vapor deposition device according to Embodiment 7, along a plane parallel to a movement direction 10a of the substrate 10. In Embodiment 7, the same reference numerals are given to components corresponding to the components described in Embodiments 1 to 6, and redundant description thereof will be omitted.

The basic configuration of the limiting plate unit 80 in Embodiment 7 is the same as in FIG. 26 described in Embodiment 5. However, in Embodiment 7, as shown in FIG. 28, the limiting plate unit 80 limits the directionalities of the first, second and third vapor deposition particles 91a, 91b and 91c in the Y axis direction such that the second region 92b and the third region 92c are contained within the first region 92a and the second region 92b and the third region 92c do not overlap on each other when regions on the substrate 10 to which the first, second and third vapor deposition particles 91a, 91b and 91c adhere if the vapor deposition mask 70 is assumed not to exist are denoted by a first, second and third regions 92a, 92b and 92c in this order. The second region 92b and the third region 92c are spaced apart in the Y axis direction.

Figure 29A:
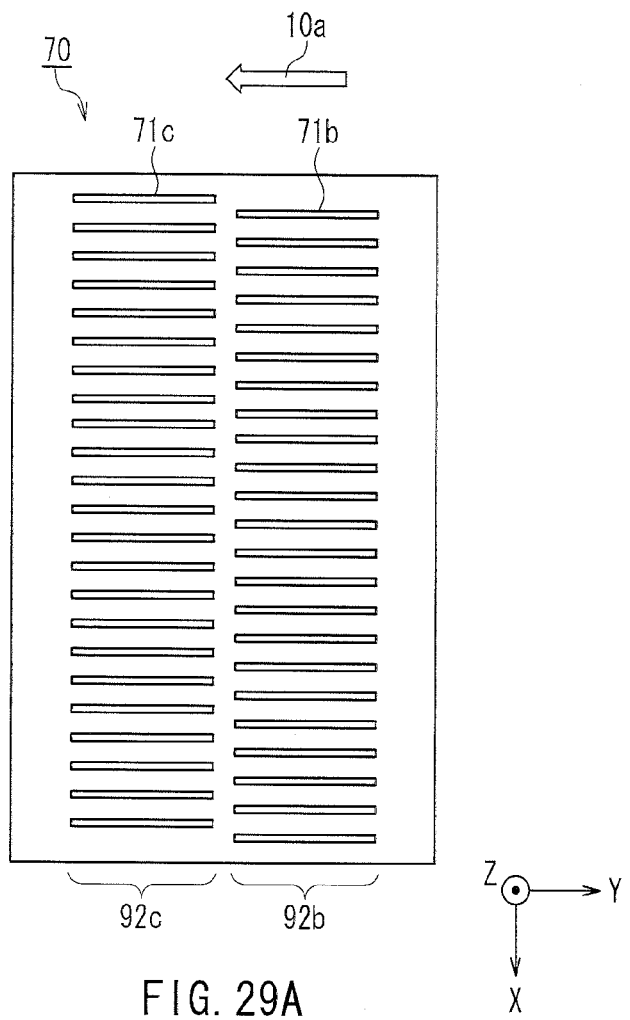
FIG. 29A is a plan view of a vapor deposition mask to be used in the vapor deposition device according to Embodiment 7 of the present invention shown in FIG. 28.

FIG. 29A is a plan view of the vapor deposition mask 70 to be used in the vapor deposition device according to Embodiment 7. FIG. 29A also shows where the positions of the second region 92b and the third region 92c in the Y axis direction that are shown in FIG. 28 correspond to the vapor deposition mask 70.

As shown in FIG. 29A, a plurality of first mask openings 71b and a plurality of second mask openings 71c are formed in the vapor deposition mask 70 respectively along the X axis direction. Although the pitches of the plurality of first mask openings 71b and the plurality of second mask openings 71c in the X axis direction are the same, the positions thereof in the X axis direction are different from one another. The plurality of first mask openings 71b are formed in a region of the vapor deposition mask 70 corresponding to the second region 92b, and the plurality of second mask openings 71c are formed in a region of the vapor deposition mask 70 corresponding to the third region 92c.

Figure 29B:
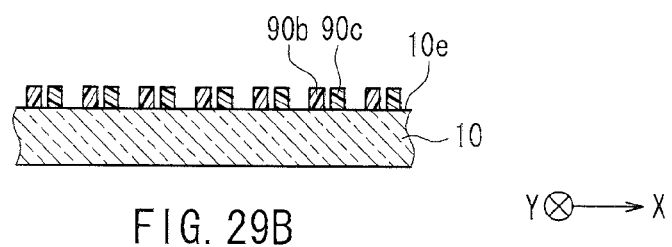
FIG. 29B is a cross-sectional view of the coating film formed on the substrate via the vapor deposition mask shown in FIG. 29A, along a plane perpendicular to the movement direction of the substrate.

As shown in FIG. 28, the substrate 10 is moved in the direction indicated by the arrow 10a from the right to the left of FIG. 28. Accordingly, the first vapor deposition particles 91a and the second vapor deposition particles 91b that have passed through the first mask openings 71b are mixed and firstly adhere to the substrate 10 so that the stripe-shaped first coating film 90b is firstly formed thereon, and the first vapor deposition particles 91a and the third vapor deposition particles 91c that have passed through the second mask openings 71c are mixed and adhere thereto so that the stripe-shaped second coating film 90c is then formed thereon. FIG. 29B is a cross-sectional view showing the first coating films 90b and the second coating films 90c formed on the substrate 10, along a plane perpendicular to the movement direction 10a of the substrate 10. As shown in FIG. 29B, similarly to Embodiment 6 (see FIG. 27), the first coating films 90b and the second coating films 90c are alternatively formed.

In the above-described step of forming a coating film, for example, if a host is used as a material of the first vapor deposition particles 91a, a luminescent dopant that emits red light is used as a material of the second vapor deposition particles 91b, and a luminescent dopant that emits green light is used as a material of the third vapor deposition particles 91c, a red light emitting layer 23R and a green light emitting layer 23G (see FIG. 3) can be formed by only moving the substrate 10 in one direction along the arrow 10a.

In the above-described example, light emitting layers in any arbitrary two colors among red, green and blue can be formed by changing types of dopants constituting the second and third vapor deposition particles 91b and 91c.

In this manner, according to Embodiment 7, a plurality of types of coating films whose compositions are different from one another can be formed in the same vacuum chamber by sharing a vapor deposition source as a host. Thus, the configuration of the vapor deposition device can be simplified. Also, a time period for vapor deposition can be shortened. Therefore, the throughput at the time of mass production is improved and the productivity is improved, as a result of which an organic EL display device can be provided at a low cost.

In Embodiment 7, the shutters (the first shutter 87b and the second shutter 87c) that block the flows of the vapor deposition particles traveling to the substrate 10 and the mask shift mechanism 73 for moving the vapor deposition mask 70 in the X axis direction are not required. Thus, the configuration of the vapor deposition device can be simplified as compared with Embodiment 6.

The movement direction of the substrate 10 may be opposite direction to the direction in the above-described example. Also, the substrate 10 may be reciprocally moved.

In the above-described example, fourth vapor deposition source openings discharging fourth vapor deposition particles for a luminescent dopant that emits blue light may be further disposed. A plurality of the fourth limiting openings through which the fourth vapor deposition particles pass are further formed in the limiting plate unit 80. The directionality of the fourth vapor deposition particles in the Y axis direction is limited by using the limiting plate unit 80 such that a fourth region on the substrate 10 to which the fourth vapor deposition particles adhere if the vapor deposition mask 70 is assumed not to exist is contained within the first region 92a and does not overlap on either one of the second region 92b and the third region 92c. A plurality of third mask openings whose pitch in the X axis direction is the same as the first and second mask openings 71b and 71c and whose positions in the X axis direction are different therefrom are formed in a region corresponding to the fourth region of the vapor deposition mask 70 along the X axis direction. The red light emitting layer 23R, the green light emitting layer 23G and the blue light emitting layer 23B (see FIG. 3) can be formed by moving the substrate 10 using such a vapor deposition device.

Embodiment 7 is the same as Embodiment 1 except for the above. The description of Embodiment 1 can also be applied to Embodiment 6. Also, variations described in Embodiments 2 to 6 may be applied to Embodiment 7.

Embodiment 8

Figure 30A:
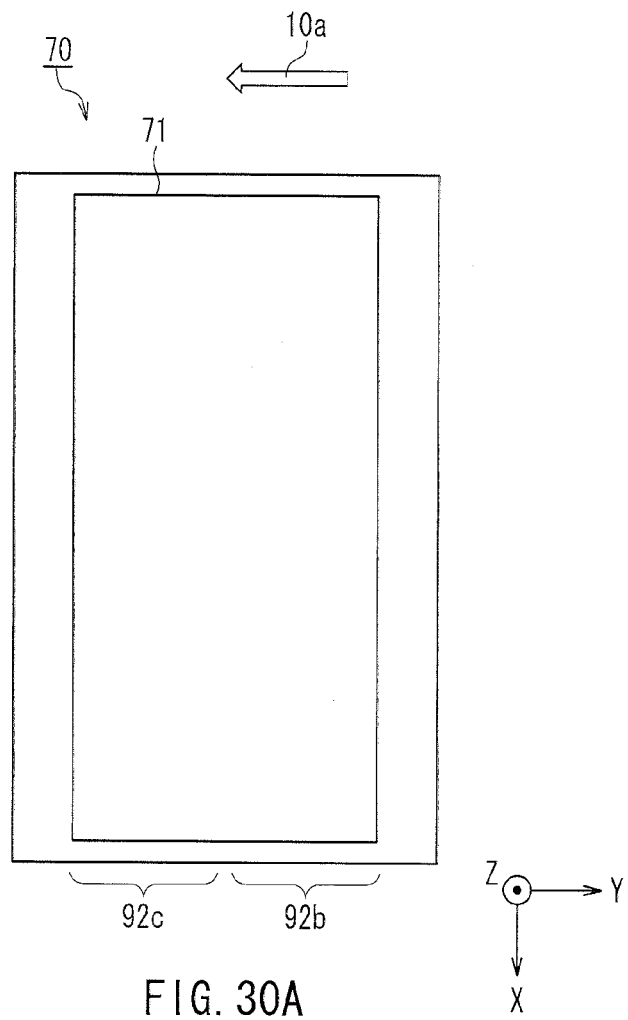
FIG. 30A is a plan view of a vapor deposition mask to be used in a vapor deposition device according to Embodiment 8 of the present invention.

A vapor deposition device of Embodiment 8 is the same as the vapor deposition device of Embodiment 7 (see FIG. 28), except for the vapor deposition mask 70. FIG. 30A is a plan view of the vapor deposition mask 70 to be used in the vapor deposition device according to Embodiment 8. As shown in FIG. 30A, a single mask opening 71 is formed in the vapor deposition mask 70. The mask opening 71 extends from a region corresponding to the second region 92b to a region corresponding to the third region 92c.

Figure 30B:
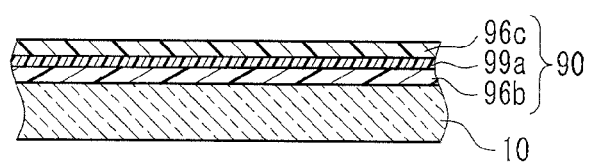
FIG. 30B is a cross-sectional view of the coating film formed on the substrate via the vapor deposition mask shown in FIG. 30A.

As shown in FIG. 28, the substrate 10 is moved in the direction indicated by the arrow 10a from the right to the left of FIG. 28. Accordingly, the first vapor deposition particles 91a and the second vapor deposition particles 91b are mixed and adhere in the second region 92b so that the first mixing layer 96b is firstly formed on the substrate 10, only the first vapor deposition particles 91a adhere in a region between the second region 92b and the third region 92c so that the first material layer 99a is then formed thereon, and the first vapor deposition particles 91a and the third vapor deposition particles 91c are mixed and adhere in the third region 92c so that the second mixing layer 96c is finally formed thereon. FIG. 30B is an enlarged cross-sectional view of the three-layer-structured coating film 90 in the thickness direction that is formed on the substrate 10 in this manner and is constituted by the first mixing layer 96b, the first material layer 99a and the second mixing layer 96c.

In the above-described step of forming the coating film 90, for example, if a host is used as a material of the first vapor deposition particles 91a, a luminescent dopant that emits red light is used as a material of the second vapor deposition particles 91b, and a luminescent dopant that emits green light is used as a material of the third vapor deposition particles 91c, a light emitting layer in which two layers that emit light in different colors from each other are laminated in the thickness direction can be formed by only moving the substrate 10 in one direction along the arrow 10a.

It is possible to cause the coating film 90 to emit light in a desired color (for example, white) as a whole by changing the type of host constituting the first vapor deposition particles 91a and the types of dopants constituting the second and third vapor deposition particles 91b and 91c. An organic EL element including such a coating film 90 as a light emitting layer can be used as, for example, a sheet-like light emitting body for illumination.

In this manner, according to Embodiment 8, a coating film in which a plurality of layers whose compositions are different from one another can be formed in the same vacuum chamber by sharing a vapor deposition source as a host. Thus, the configuration of the vapor deposition device can be simplified. Also, a time period for vapor deposition can be shortened. Therefore, the throughput at the time of mass production is improved and the productivity is improved, as a result of which an organic EL display device can be provided at a low cost.

The movement direction of the substrate 10 may be the opposite direction to the direction in the above-described example. In this case, the configuration of layers constituting the coating film 90 is the reverse of that of FIG. 30B.

The shape of the mask opening 71 of the vapor deposition mask 70 is not limited to FIG. 30A. The mask opening 71 needs only to extend along the Y axis direction from the region corresponding to the second region 92b to the region corresponding to the third region 92c.

Embodiment 8 is the same as Embodiment 1 except for the above. The description of Embodiment 1 can also be applied to Embodiment 8. Also, variations described in Embodiments 2 to 7 may be applied to Embodiment 8.

Embodiment 9

In Embodiments 1 to 8 described above, the substrate 10 is moved relative to the vapor deposition unit 50 including the vapor deposition mask 70, in a state in which the substrate 10 is spaced apart from the vapor deposition mask 70 at only a fixed spacing. In contrast, in Embodiment 9, the vapor deposition mask 70 is fixed to the substrate 10 and the integrated article of the substrate 10 and the vapor deposition mask 70 is moved relative to the vapor deposition unit 50 constituted by the vapor deposition source 60 and the limiting plate unit 80.

Figure 31:
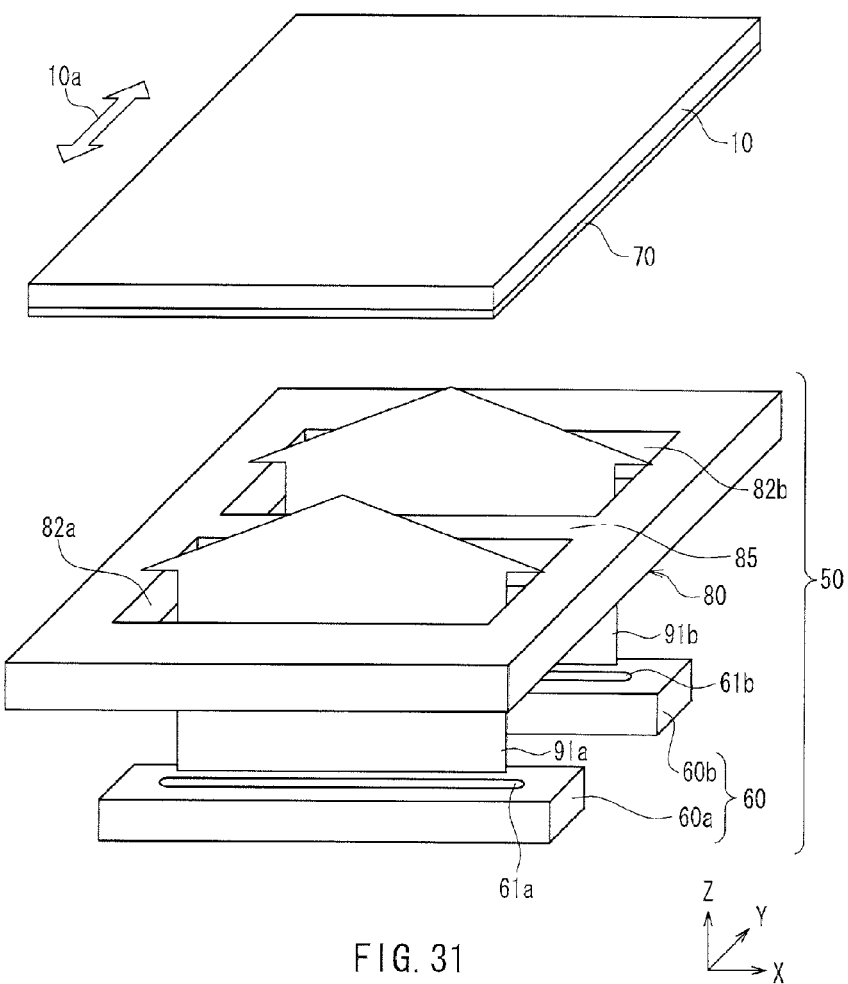
FIG. 31 is a perspective view showing the basic configuration of a vapor deposition device according to Embodiment 9 of the present invention.
Figure 32:
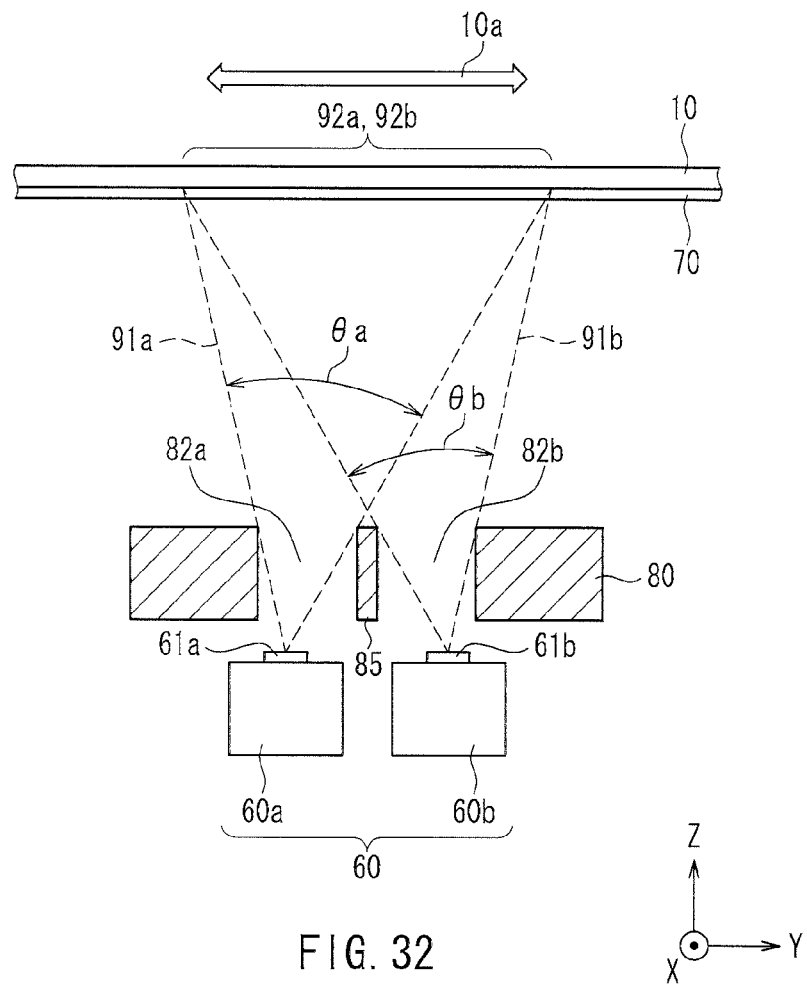
FIG. 32 is a cross-sectional view showing how a coating film is formed on a substrate in the vapor deposition device according to Embodiment 9 of the present invention, along a plane parallel to the movement direction of the substrate.

FIG. 31 is a perspective view showing the basic configuration of a vapor deposition device according to Embodiment 9. FIG. 32 is a cross-sectional view showing how a coating film is formed on a substrate 10 in the vapor deposition device according to Embodiment 9, along a plane parallel to a movement direction 10a of the substrate 10. In Embodiment 9, the same reference numerals are given to components corresponding to the components described in Embodiments 1 to 8, and redundant description thereof will be omitted. Hereinafter, Embodiment 9 will be described, focusing on differences from Embodiment 1.

The vapor deposition mask 70 is laminated on and is integrated into the substrate 10. Therefore, the vapor deposition mask 70 has a dimension capable of covering the entire deposition surface of the substrate 10. A mask opening (not shown) corresponding to a pattern of a coating film that is to be formed on the substrate 10 is formed in the substrate 10. The integrated article of the substrate 10 and the vapor deposition mask 70 is scanned (moved) by a moving mechanism (not shown) along the movement direction 10a parallel to the Y axis at a constant speed. The movement of the substrate 10 may be a reciprocal movement or a single direction movement in which the substrate 10 is moved in either direction.

The vapor deposition source 60 includes a first vapor deposition source 60a and a second vapor deposition source 60b. The first vapor deposition source 60a and the second vapor deposition source 60b respectively include a first vapor deposition source opening 61a and a plurality of second vapor deposition source openings 61b, in their upper surfaces (that is, the surface opposing the vapor deposition mask 70). The first vapor deposition source opening 61a and the plurality of second vapor deposition source openings 61b respectively have a slot shape extending in the X axis direction.

A first limiting opening 82a and a second limiting opening 82b are formed in the limiting plate unit 80. The first limiting opening 82a and the second limiting opening 82b neighbor in the Y axis direction via the separation plate 85. The first and second limiting plates 81a and 81b (see FIG. 5) of Embodiment 1 that respectively separate the first and second limiting plate openings 82a and 82b in the Y axis direction are not provided in Embodiment 9.

The first vapor deposition particles 91a discharged from the first vapor deposition source opening 61a pass through the first limiting opening 82a of the limiting plate unit 80 and the mask opening of the vapor deposition mask 70 in this order, and adhere to the substrate 10. The second vapor deposition particles 91b discharged from the second vapor deposition source opening 61b pass through the second limiting opening 82b of the limiting plate unit 80 and the mask opening of the vapor deposition mask 70 in this order, and adhere to the substrate 10.

As shown in FIG. 32, similarly to Embodiment 1, the limiting plate unit 80 limits the directionalities in the Y axis direction of the first vapor deposition particles 91a and the second vapor deposition particles 91b traveling to the substrate 10 such that if regions on the substrate 10 to which the first vapor deposition particles 91a and the second vapor deposition particles 91b adhere if the vapor deposition mask 70 is assumed not to exist are respectively denoted by the first region 92a and the second region 92b, the first region 92a substantially coincides with the second region 92b, as viewed along the X axis direction. Therefore, when the integrate article of the substrate 10 and the vapor deposition mask 70 pass across the first and second regions 92a and 92b, the first and second vapor deposition particles 91a and 91b pass through the mask opening of the vapor deposition mask 70 and adhere to the substrate 10 so that a coating film which has a uniform mixing ratio between the first vapor deposition particles 91a and the second vapor deposition particles 91b in the thickness direction can be formed.

A coating film having the same pattern as the mask opening formed in the vapor deposition mask 70 is formed on the substrate 10. Unlike Embodiments 1 to 8, a coating film having a discontinuous pattern in the Y axis direction can be easily formed.

In Embodiment 9, the vapor deposition mask 70 is fixed to the substrate 10, and therefore the spacing between the substrate 10 and the vapor deposition mask 70 can be reduced as compared with Embodiment 1. Therefore, the width We of the blurred portion 90e (see FIG. 11) at the edge of the coating film is theoretically reduced. Thus, unlike Embodiment 1, there is little need to limit the incidence angles of the first and second vapor deposition particles 91a and 91b in the X axis direction that enter the mask opening of the vapor deposition mask 70. In view of this, unlike Embodiment 1, the first and second limiting plates 81a and 81b are omitted in the limiting plate unit 80 in Embodiment 9, and the first and second vapor deposition source openings 61a and 61b are formed to have a slot shape. As a result, it is possible to improve the vapor deposition rate and the throughput at the time of mass production. However, similarly to Embodiment 1, the first and second limiting plates 81a and 81b may be provided in the limiting plate unit 80, and the first and second vapor deposition source openings 61a and 61b may be formed to have a nozzle shape. This is effective for a case where it is difficult for the substrate 10 and the vapor deposition mask 70 to be in close contact with each other, such as a case where for example, the substrate 10 and the vapor deposition mask 70 are made large.

Embodiment 9 is the same as Embodiment 1 except for the above. The description of Embodiment 1 can also be applied to Embodiment 9. Furthermore, variations described in Embodiments 2 to 5 and 8 may be applied to Embodiment 9.

Embodiments 1 to 9 described above are merely examples. The present invention is not limited to Embodiments 1 to 9 described above, and can be changed as appropriate.

The shapes of the vapor deposition source openings of the vapor deposition source 60 can be set to any arbitrary shape. For example, the shapes of the vapor deposition source openings of Embodiments 1 to 8 may be a slot shape extending along the X axis direction shown in FIG. 9.

If the substrate 10 has a large dimension in the X axis direction, a plurality of vapor deposition units 50 as shown in the above-described embodiments may be arranged at different positions in the X axis direction and in the Y axis direction.

Although the inner circumferential surfaces of the limiting plate unit defining the limiting openings 82a, 82b and 82c are flat surfaces parallel to the Z axis in Embodiments 1 to 9 described above, the present invention is not limited to this. For example, the inner circumferential surface may be an inclined surface that is inclined with respect to the Z axis or a curved surface. Also, the inner circumferential surface may be a complex surface constituted by combining two or more flat surfaces and curved surfaces.

In Embodiments 1 to 9 described above, the substrate 10 is moved relative to the vapor deposition unit 50 that is stationary, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In Embodiments 1 to 9 described above, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

In Embodiments 1 to 9 described above, a case where a light emitting layer for an organic EL element is formed is described as an example, but the present invention can be used for a case in which various thin films other than a light emitting layer for an organic EL element are formed by a vapor deposition method.

INDUSTRIAL APPLICABILITY

There is no particular limitation on the fields to which the vapor deposition device and vapor deposition method of the present invention can be applied, and the present invention is preferably used to form light emitting layers for use in organic EL display devices.

DESCRIPTION OF SYMBOLS

10 Substrate
10a First direction
10e Deposition Surface
20 Organic EL Element
23R, 23G, 23B Light Emitting Layer
50 Vapor Deposition Unit
56 Moving Mechanism
60 Vapor Deposition Source
60a First Vapor Deposition Source
60b Second Vapor Deposition Source
60c Third Vapor Deposition Source
61a First Vapor Deposition Source Opening
61b Second Vapor Deposition Source Opening
61c Third Vapor Deposition Source Opening
70 Vapor Deposition Mask
71 Mask Opening
71b First Mask Opening
71c Second Mask Opening
73 Mask Shift Mechanism
80 Limiting Plate Unit
80a First Limiting Plate Unit
80b Second Limiting Plate Unit
81a First Limiting Plate
81b Second Limiting Plate
81c Third Limiting Plate
82a First Limiting Opening
82b Second Limiting Opening
82c Third Limiting Opening
85 Separation Plate
85b First Separation Plate
85c Second Separation Plate
87b First Shutter
87c Second Shutter
90 Coating Film
90b First Coating Film
90c Second Coating Film
90e Blurred Portion
90m Coating Film Main Portion
91a First Vapor Deposition Particles
91b Second Vapor Deposition Particles
91c Third Vapor Deposition Particles
92a First Region
92b Second Region
92c Third Region
96b First Mixing Layer
96c Second Mixing Layer
99a First Material Layer
99m Mixing Layer

The invention claimed is:

1. A vapor deposition device that forms, via a vapor deposition mask in which a mask opening is formed, a coating film having a pattern corresponding to an opening shape of the mask opening on a substrate, the vapor deposition device comprising:

a vapor deposition unit including a vapor deposition source having at least one first vapor deposition source opening and at least one second vapor deposition source opening, and a limiting plate unit in which a plurality of or single first limiting opening(s) through which first vapor deposition particles discharged from the at least one first vapor deposition source opening pass and a plurality of second limiting opening through which second vapor deposition particles discharged from the at least second vapor deposition source opening pass are formed; and a moving mechanism that moves one of the substrate and the vapor deposition unit relative to the other along a first direction orthogonal to a normal line direction of the substrate, wherein the at least one first vapor deposition source opening and the at least one second vapor deposition source opening are disposed at different positions in the first direction, the plurality of or single first limiting opening(s) and the plurality of second limiting openings are disposed at different positions in the first direction, if regions on the substrate to which the first vapor deposition particles and the second vapor deposition particles adhere if the vapor deposition mask is assumed not to exist are respectively denoted by a first region and a second region, the limiting plate unit limits directionalities of the first vapor deposition particles and the second vapor deposition particles in the first direction that travel to the substrate such that the second region is contained within the first region, as viewed along a second direction orthogonal to the first direction and the normal line direction of the substrate, and when the plurality of first limiting openings are formed in the limiting plate unit, the plurality of first limiting openings are partitioned by a plurality of first limiting plates in the second direction, the plurality of second limiting openings are partitioned by a plurality of second limiting plates in the second direction, the plurality of first limiting plates limit incidence angles of the first vapor deposition particles in the second direction that enter the mask opening, and the plurality of second limiting plates limit incidence angles of the second vapor deposition articles in the second direction that enter the mask opening, when the single first limiting opening is formed in the limiting plate unit, the plurality of second limiting openings are partitioned by a plurality of second limiting plates in the second direction, and the plurality of second limiting plates limit incidence angles of the second vapor deposition particles in the second direction that enter the mask opening.

2. The vapor deposition device according to claim 1, wherein the limiting plate unit limits directionalities of the first vapor deposition particles and the second vapor deposition particles in the first direction that travel to the substrate such that the first region protrudes beyond the second region in the first direction.

3. The vapor deposition device according to claim 1, wherein the at least one first vapor deposition source opening and the at least one second vapor deposition source opening are provided in a shared vapor deposition source.

4. The vapor deposition device according to claim 1, wherein the first limiting opening(s) and the plurality of second limiting openings are formed in a shared limiting plate unit.

5. The vapor deposition device according to claim 1, wherein the vapor deposition source further includes at least one third vapor deposition source opening, at least one third limiting opening through which third vapor deposition particles discharged from the at least one third vapor deposition source opening pass is further formed in the limiting plate unit, the at least one third vapor deposition source opening is disposed at a different position in the first direction from the positions of the at least one first vapor deposition source opening and the at least one second vapor deposition source opening, the at least one third limiting opening is disposed at a different position in the first direction from the positions of the first limiting opening(s) and the plurality of second limiting openings, and if a region on the substrate to which the third vapor deposition particles adhere if the vapor deposition mask is assumed not to exist is denoted by a third region, the limiting plate unit limits a directionality of the third vapor deposition particles in the first direction that travel to the substrate such that the third region is contained within the first region, as viewed along the second direction.

6. A vapor deposition method comprising a vapor deposition step of forming a coating film having a predetermined pattern on a substrate by causing vapor deposition particles to adhere onto the substrate, wherein the vapor deposition step is performed by using the vapor deposition device according to claim 1.

7. A vapor deposition method comprising a vapor deposition step of forming a coating film having a predetermined pattern on a substrate by causing vapor deposition particles to adhere onto the substrate, wherein the vapor deposition step is performed by using the vapor deposition device according to claim 1, the single first limiting opening is formed in the limiting plate unit, and the coating film includes a coating film main portion in which the first vapor deposition particles and the second vapor deposition particles are mixed and blurred portions that are formed on both sides of the coating film main portion in the second direction and are made only of the first vapor deposition particles.

8. A vapor deposition method comprising a vapor deposition step of forming a coating film having a predetermined pattern on a substrate by causing vapor deposition particles to adhere onto the substrate, wherein the vapor deposition step is performed by using the vapor deposition device according to claim 2, and the coating film includes a mixing layer in which the first vapor deposition particles and the second vapor deposition particles are mixed and a first material layer that is laminated on at least one side of the mixing layer and is made only of the first vapor deposition particles.

9. The vapor deposition device according to claim 4, wherein the limiting plate unit includes a separation plate between the first limiting opening(s) and the plurality of second limiting openings neighboring in the first direction, and a surface of the separation plate on the side of the substrate is disposed at a position farther away from the substrate than a surface of a portion other than the separation plate of the limiting plate unit on the side of the substrate.

10. The vapor deposition device according to claim 5, wherein the limiting plate unit limits directionalities of the first vapor deposition particles, the second vapor deposition particles and the third vapor deposition particles in the first direction that travel to the substrate such that the position of the second region coincides with the position of the third region in the first direction and the first region protrudes beyond the second region and the third region in the first direction.

11. The vapor deposition device according to claim 5, wherein the limiting plate unit limits directionalities of the first vapor deposition particles, the second vapor deposition particles and the third vapor deposition particles in the first direction that travel to the substrate such that the second region and the third region do not overlap on each other and the first region contains the second region and the third region, as viewed along the second direction.

12. The vapor deposition device according to claim 5,
wherein a plurality of third limiting openings through which the third vapor deposition particles pass are formed in the limiting plate unit,
the plurality of third limiting openings are partitioned by a plurality of third limiting plates in the second direction, and
the plurality of third limiting plates limit incidence angles of the third vapor deposition particles in the second direction that enter the mask opening.

13. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 5, and
the coating film includes a coating film main portion in which the first vapor deposition particles, the second vapor deposition particles and the third vapor deposition particles are mixed and blurred portions that are formed on both sides of the coating film main portion in the second direction and are made only of the first vapor deposition particles.

14. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 10, and
the coating film includes a mixing layer in which the first vapor deposition particles, the second vapor deposition particles and the third vapor deposition particles are mixed and a first material layer that is laminated on at least one side of the mixing layer and is made only of the first vapor deposition particles.

15. The vapor deposition device according to claim 11,
wherein the vapor deposition unit includes the vapor deposition mask,
the mask opening formed in the vapor deposition mask includes a first mask opening formed in a region of the vapor deposition mask corresponding to the second region and a second mask opening formed in a region of the vapor deposition mask corresponding to the third region, and
the first mask opening and the second mask opening are disposed at different positions from each other in the second direction.

16. The vapor deposition device according to claim 11,
wherein the vapor deposition unit includes the vapor deposition mask, and
the mask opening formed in the vapor deposition mask extends along the first direction from the region corresponding to the second region to the region corresponding to the third region.

17. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 11, and
a first coating film in which the first vapor deposition particles and the second vapor deposition particles are mixed and a second coating film in which the first vapor deposition particles and the third vapor deposition particles are mixed are formed at different positions on the substrate.

18. A vapor deposition method comprising a vapor deposition step of forming a coating film having a predetermined pattern on a substrate by causing vapor deposition particles to adhere onto the substrate,
wherein the vapor deposition step is performed by using the vapor deposition device according to claim 16, and
the coating film contains a first mixing layer in which the first vapor deposition particles and the second vapor deposition particles are mixed and a second mixing layer in which the first vapor deposition particles and the third vapor deposition particles are mixed.

19. The vapor deposition method according to claim 18, wherein the coating film contains a first material layer made only of the first particles between the first mixing layer and the second mixing layer.

* * * * *